(12) United States Patent
Baker, Jr.

(10) Patent No.: US 9,666,276 B2
(45) Date of Patent: May 30, 2017

(54) NON-VOLATILE MEMORY USING BI-DIRECTIONAL RESISTIVE ELEMENTS

(71) Applicant: Frank K. Baker, Jr., Austin, TX (US)

(72) Inventor: Frank K. Baker, Jr., Austin, TX (US)

(73) Assignee: NXP USA, Inc., Austin, TX (US)

( * ) Notice: Subject to any disclaimer, the term of this patent is extended or adjusted under 35 U.S.C. 154(b) by 69 days.

(21) Appl. No.: 14/266,168

(22) Filed: Apr. 30, 2014

(65) Prior Publication Data

US 2015/0318024 A1 Nov. 5, 2015

(51) Int. Cl.
*G11C 5/06* (2006.01)
*G11C 14/00* (2006.01)
*G11C 13/00* (2006.01)

(52) U.S. Cl.
CPC ............ *G11C 14/009* (2013.01); *G11C 5/06* (2013.01); *G11C 13/0069* (2013.01); *G11C 14/0081* (2013.01)

(58) Field of Classification Search
CPC ..... G11C 14/009; G11C 14/0081; G11C 5/06; G11C 13/0069
See application file for complete search history.

(56) References Cited

U.S. PATENT DOCUMENTS

| | | | |
|---|---|---|---|
| 4,271,487 A | 6/1981 | Draycraft et al. |
| 4,499,560 A | 2/1985 | Brice |
| 4,809,225 A | 2/1989 | Dimmler et al. |
| 4,980,859 A | 12/1990 | Guterman et al. |
| 5,361,224 A | 11/1994 | Takasu |
| 6,069,816 A | 5/2000 | Nishimura |
| 6,980,459 B2 | 12/2005 | Seshadri et al. |
| 7,038,938 B2 | 5/2006 | Kang |
| 7,079,415 B2 | 7/2006 | Frey |
| 7,206,217 B2 | 4/2007 | Tanaka et al. |
| 7,796,417 B1 | 9/2010 | Lewis |
| 8,169,825 B1 | 5/2012 | Shalvi et al. |
| 8,605,490 B2 | 12/2013 | Fackenthal |
| 8,947,913 B1 | 2/2015 | Derhacobian et al. |
| 9,330,755 B1 | 5/2016 | Van Buskirk |
| 2002/0064067 A1 | 5/2002 | Inui |
| 2004/0052105 A1 | 3/2004 | Fulkerson et al. |

(Continued)

FOREIGN PATENT DOCUMENTS

| | | |
|---|---|---|
| JP | 60144977 A | 7/1985 |
| JP | 2002109875 A | 4/2002 |

(Continued)

OTHER PUBLICATIONS

Chang, MF., et al., "Circuit Design Challenges in Embedded Memory and Resistive RAM (RRAM) for Mobile SoC and 3D-IC", IEEE, 2D-1, Aug. 2011, pp. 197-203.

(Continued)

*Primary Examiner* — Pho M Luu
*Assistant Examiner* — Mohammed A Bashar

(57) ABSTRACT

A memory cell includes a first storage node and a second storage node that is complementary to the first storage node. A first bidirectional resistive memory element (BRME) includes a first terminal, a second BRME includes a first terminal. A first access transistor couples the first storage node to a first bit line. A second access transistor couples the second storage node to a second bit line. A third transistor couples the first terminal of the first BRME to the second bit line. A fourth transistor couples the first terminal of the second BRME to the first bit line.

20 Claims, 17 Drawing Sheets

(56) References Cited

U.S. PATENT DOCUMENTS

| | | |
|---|---|---|
| 2004/0052106 A1 | 3/2004 | Ohtani et al. |
| 2004/0125643 A1 | 7/2004 | Kang et al. |
| 2007/0041242 A1 | 2/2007 | Okazaki et al. |
| 2011/0044109 A1 | 2/2011 | Shih et al. |
| 2011/0122684 A1 | 5/2011 | Sheu et al. |
| 2011/0280073 A1 | 11/2011 | Chiu et al. |
| 2012/0020159 A1 | 1/2012 | Ong |
| 2013/0135921 A1 | 5/2013 | Owada |
| 2013/0148447 A1 | 6/2013 | Shaeffer et al. |
| 2014/0293711 A1 | 10/2014 | Kato et al. |
| 2015/0016176 A1 | 1/2015 | Chuang et al. |

FOREIGN PATENT DOCUMENTS

| | | |
|---|---|---|
| JP | 2011081896 A | 4/2011 |
| KR | 20020002823 A | 1/2002 |

OTHER PUBLICATIONS

Ohsawa, T., et al., "1Mb 4T-2MTJ Nonvolatile STT-RAM for Embedded Memories Using 32b Fine-Grained Power Gating Technique with 1.0ns/200ps Wake-up/Power-off Times", 2012 Symposium on VLSI Circuits Digest of Technical Papers, Jun. 2012, pp. 46-47.

Butcher, B., et al., "Hot Forming to Improve Memory Window and Uniformity of Low-Power HfOx-Based RRAMS", IEEE 4th International Memory Workshop in Milan, Italy, May 20-23, 2012, pp. 1-4.

Worledge, D.C., et al., "Recent Advances in Spin Torque MRAM", IEEE, Sep. 2012, pp. 1-3.

Hayakawa, J., et al., "Current-Driven Magnetization Switching in CoFeB/MgO/CoFeB Magnetic Tunnel Junctions", Japanese Journal of Applied Physics, vol. 44, No. 41, 2005, pp. L1267-L1270.

Non-Final Office Action mailed Apr. 10, 2015 for U.S. Appl. No. 14/288,517, 17 pages.

U.S. Appl. No. 15/166,400, Baker Jr., Frank K., "Non-Volatile Memory Using Bi-Directional Resistive Elements", Office Action—Non-Final Rejection, mailed Oct. 11, 2016.

U.S. Appl. No. 15/166,400, Baker Jr., F., "Non-Volatile Memory Using Bi-Directional Resistive Elements", Office Action—Final Rejection, mailed Feb. 10, 2017.

U.S. Appl. No. 14/288,517, Baker Jr., F., "Non-Volatile Memory Using Bi-Directional Resistive Elements", Office Action—Notice of Allowance, mailed Mar. 4, 2016.

NON-VOLATILE MEMORY USING BI-DIRECTIONAL RESISTIVE ELEMENTS

BACKGROUND

Field of the Disclosure

The present disclosure relates in general to non-volatile memories, and more specifically to systems and methods for non-volatile memory that use bi-directional resistive elements.

Description of the Related Art

Memories with resistive storage elements are under development across the semiconductor industry that are geared to replace conventional dynamic random access memory (DRAM) and RAM devices. The resistive memory devices include magnetoresistive random access memory (MRAM), Resistive random-access memory (RRAM or ReRAM), phase-change memory (PCM), among others. Most of the resistive memory devices are implemented in one transistor/one resistive element or one diode/one resistive element memory cell configurations, which provide minimal cell area but exhibit relatively slow read and write performance (e.g., approximately 30 nanoseconds or more per operation). Thus, resistive memory devices are not a viable substitute for much of the SRAM in a higher performance system where read/write operations occur within a few clock cycles. It is also difficult to produce a reliable one transistor/one resistive element or one diode/one resistive element memory.

Memory cells with one transistor and one resistive element may eventually replace embedded flash on future SoCs, but it is desirable to use these same elements to replace the static random access memory (SRAM) as well. Potentially, less flash would be needed, or the system could use a more efficient architecture, if the 'fast' memory such as SRAM was also compact and non-volatile.

BRIEF DESCRIPTION OF THE DRAWINGS

The benefits, features, and advantages of the present disclosure will become better understood with regard to the following description, and accompanying drawings where.

DETAILED DESCRIPTION

Integrated circuit devices and methods are disclosed that utilize resistive storage elements operating bi-directionally as non-volatile storage with read and write speeds comparable to conventional SRAM. For example, read operations may complete in less than five nanoseconds and write operations may complete in less than ten nanoseconds. A four transistor dynamic random access memory (DRAM) or six transistor SRAM cell can be modified by connecting each of the storage nodes through a bidirectional resistive element. Data is written to the cell at full speed using conventional techniques, followed by programming the resistive elements to store the data in a nonvolatile fashion. Upon power-up, the differential states of the resistive elements will restore the cell to the previous state. Operating at speeds comparable to conventional SRAM allows memory with resistive elements to replace conventional DRAM and SRAM in a large number of products, resulting in memory devices with lower standby power and the ability to retain data when powered down.

Figure 1:
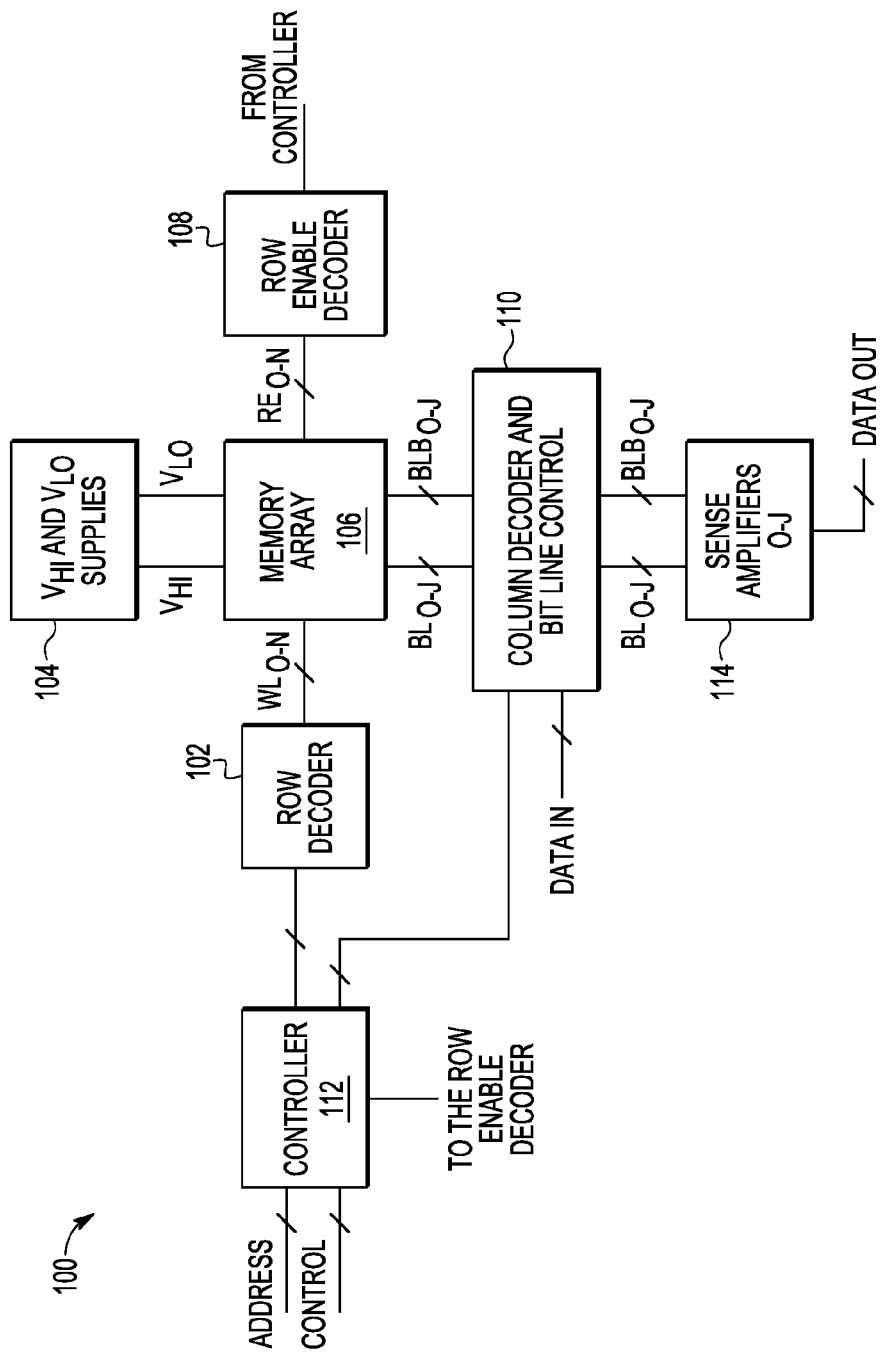
FIG. 1 is a block diagram of an integrated circuit device including a non-volatile memory (NVM) according to one embodiment.

FIG. 1 is a block diagram of an integrated circuit device including a non-volatile memory (NVM) device 100 according to one embodiment. NVM device 100 includes NVM array 106 coupled to controller 112, row decoder 102, specialized array power supplies 104, row enable decoder 108, and column decoder and bit line control 110. Sense amplifiers 114 are coupled to column decoder and bit line control 110. Controller 112 receives address and control signals from a processor and is coupled to row decoder 102 and column decoder and bit line control 110. Data to be written to memory array 106 is provided from a processor to column decoder and bit line control 110. Word lines $WL_{0-N}$ are coupled between row decoder 102 and memory array 106.

NVM controller 112 controls program and erase procedures of the NVM array 106 through row decoder 102 and column decoder and bit line control 110, such as in response to one or more processors. NVM controller 112 accesses memory cells within NVM array 106 by providing a row address to the row decoder 102 and a column address to column decoder and bit line control 110. Data is written into or read from the NVM array 106 via column decoder and bit line control 110. Row enable decoder 108 receives address information from controller 112 and provides row enable signals, $RE_{0-N}$, to memory array 106.

True bit lines $BL_{0-J}$ and complementary bit lines $BLB_{0-J}$ are coupled between memory array 106 and column decoder and bit line control 110, and between sense amplifiers 114 and column decoder and bit line control 110. Sense amplifiers 114 provide data from memory array 106 to one or more processors.

NVM device 100 may be implemented as part of a System On Chip (SOC) or the like which includes at least one processor (not shown) coupled to the NVM device 100 via an appropriate interface (not shown), such as a bus or the like with multiple signals or bits. The integrated circuit device may include other circuits, modules or devices, such as other memory devices (not shown), other functional modules (not shown), and external interfaces, such as input, output or input/output (I/O) ports or pins or the like (not shown). In one alternative embodiment, the NVM device 100 is implemented alone in an integrated circuit without any other devices. In another alternative embodiment, NVM device 100 is part of a larger system on the integrated circuit.

Figure 2:
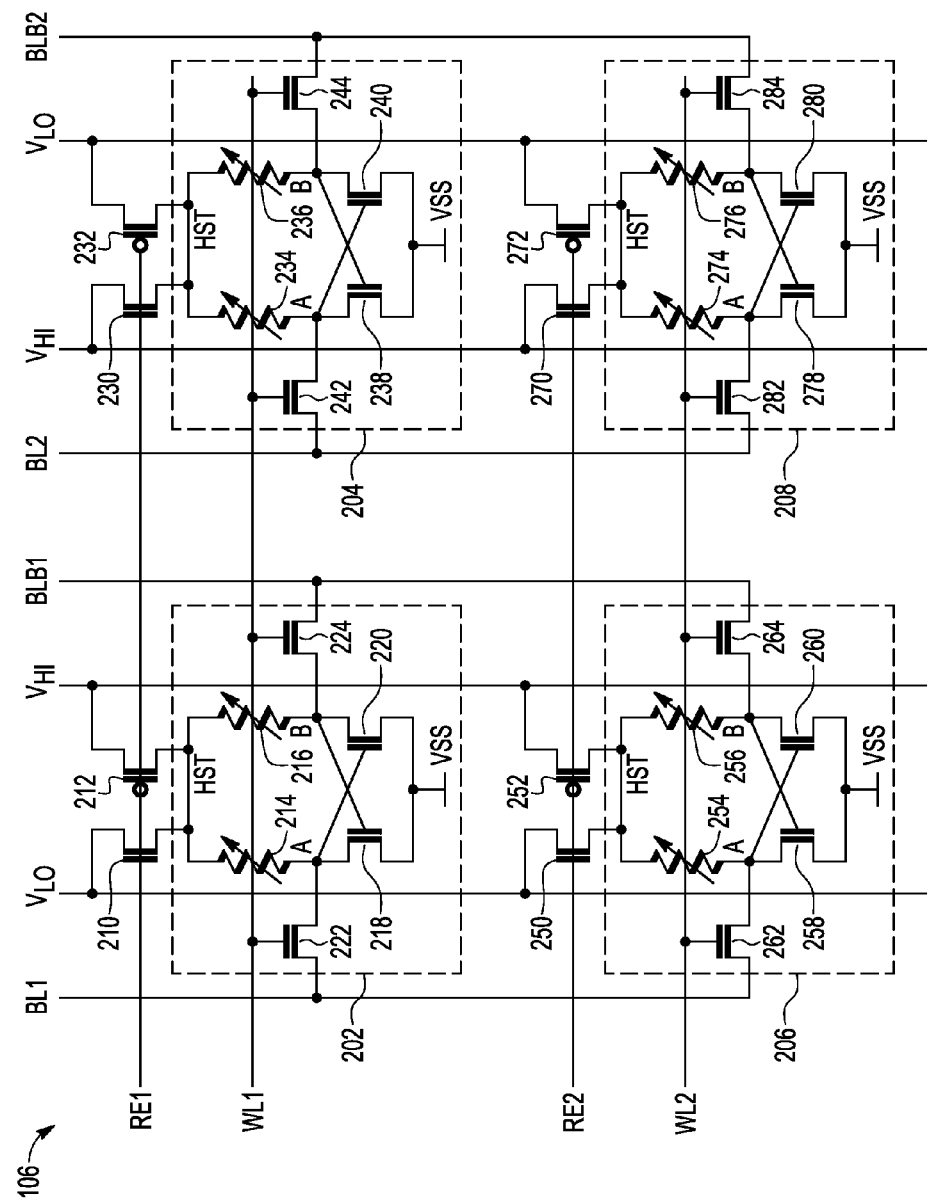
FIG. 2 is a schematic diagram of an embodiment of a memory array that may be used in the NVM device of FIG. 1.

FIG. 2 is a schematic diagram of an embodiment of a memory array 106 that may be used in the NVM device 100 of FIG. 1. As shown, memory array 106 includes four memory cells 202, 204, 206, 208 arranged in two columns and two rows, however, memory array 106 can include any suitable number of memory cells and any suitable number of rows and columns.

The structure of memory cell 202 includes variable, bi-directional resistive elements 214, 216, and N-channel transistors 218, 220, 222, 224. Resistive element 214 is coupled in series with transistor 218, and resistive element 216 is coupled in series with transistor 220. Resistive element 214 and transistor 218 are coupled in parallel to resistive element 216 and transistor 220 and connected at a high supply terminal (HST) node. Transistor 218 has a drain electrode coupled to a first terminal of resistive element 214, a source electrode coupled to Vss and a gate electrode coupled to a drain electrode of transistor 220. Transistor 220 has a drain electrode coupled to a first terminal of resistive element 216, a source electrode coupled to Vss and a gate electrode coupled to a drain electrode transistor 218. Resistive elements 214 and 216 each have a fixed orientation between the anode and the cathode, as is designated by the diagonal arrows. Note that the same terminal type of each resistive element is connected to the HST node, to ensure proper operation during resistive element write operations.

Pass transistor 222 has a drain electrode coupled to first bit line BL1, a gate electrode coupled to first word line WL1, and a source electrode coupled to the drain electrode of transistor 218. Pass transistor 224 has a drain electrode coupled to first complementary bit line BLB1, a gate electrode coupled to a first word line WL1, and a source electrode coupled to the drain electrode of transistor 220.

N-channel transistor 210 is coupled to memory cell 202 and is used to control current through resistive elements 214 and 216. N-channel transistor 210 has a drain electrode coupled to a low voltage source V-LO, a source electrode coupled to a first terminal of resistive element 214 at the HST node, and a gate electrode coupled to a first row enable signal RE1.

P-channel transistor 212 is coupled to memory cell 202 and is used to control current through resistive elements 214 and 216. P-channel transistor 212 has a source electrode coupled to a high voltage source V-HI, a drain electrode coupled to a first terminal of resistive element 216 at the HST node, and a gate electrode coupled to a first row enable signal RE1.

The structure of memory cell 204 includes variable, bi-directional resistive elements 234, 236, and N-channel transistors 238, 240, 242, 244. Resistive element 234 is coupled in series with transistor 238, and resistive element 236 is coupled in series with transistor 240. Resistive element 234 and transistor 238 are coupled in parallel to resistive element 236 and transistor 240 and connected at a high supply terminal (HST) node. Transistor 238 has a drain electrode coupled to a first terminal of resistive element 234, a source electrode coupled to Vss and a gate electrode coupled to a drain electrode of transistor 240. Transistor 240 has a drain electrode coupled to a first terminal of resistive element 236, a source electrode coupled to Vss and a gate electrode coupled to the drain electrode transistor 238.

Pass transistor 242 has a drain electrode coupled to second bit line BL2, a gate electrode coupled to first word line WL1, and a source electrode coupled to the drain electrode of transistor 238. Pass transistor 244 has a drain electrode coupled to second complementary bit line BLB2, a gate electrode coupled to a first word line WL1, and a source electrode coupled to the drain electrode of transistor 240.

N-channel transistor 230 is coupled to memory cell 204 and is used to control current through resistive elements 234 and 236. N-channel transistor 230 has a drain electrode coupled to a high voltage source V-HI, a source electrode coupled to a first terminal of resistive element 234 at the HST node, and a gate electrode coupled to a first row enable signal RE1.

P-channel transistor 232 is coupled to memory cell 204 and is used to control current through resistive elements 234 and 236. P-channel transistor 232 has a source electrode coupled to a low voltage source V-LO, a drain electrode coupled to a first terminal of resistive element 236 at the HST node, and a gate electrode coupled to a first row enable signal RE1.

The structure of memory cell 206 includes variable, bi-directional resistive elements 254, 256, and N-channel transistors 258, 260, 262, 264. Resistive element 254 is coupled in series with transistor 258, and resistive element 256 is coupled in series with transistor 260. Resistive element 254 and transistor 258 are coupled in parallel to resistive element 256 and transistor 260 and connected at a high supply terminal (HST) node. Transistor 258 has a drain electrode coupled to a first terminal of resistive element 254, a source electrode coupled to Vss and a gate electrode coupled to a drain electrode of transistor 260. Transistor 260 has a drain electrode coupled to a first terminal of resistive element 256, a source electrode coupled to Vss and a gate electrode coupled to a drain electrode transistor 258.

Pass transistor 262 has a drain electrode coupled to first bit line BL1, a gate electrode coupled to second word line WL2, and a source electrode coupled to the drain electrode of transistor 258. Pass transistor 264 has a drain electrode coupled to first complementary bit line BLB1, a gate electrode coupled to a second word line WL2, and a source electrode coupled to the drain electrode of transistor 260.

N-channel transistor 250 is coupled to memory cell 206 and is used to control current through resistive elements 254 and 256. N-channel transistor 250 has a drain electrode coupled to a low voltage source V-LO, a source electrode coupled to a first terminal of resistive element 254 at the HST node, and a gate electrode coupled to a second row enable signal RE2.

P-channel transistor 252 is coupled to memory cell 206 and is used to control current through resistive elements 254 and 256. P-channel transistor 252 has a source electrode coupled to a high voltage source V-HI, a drain electrode coupled to a first terminal of resistive element 256 at the HST node, and a gate electrode coupled to a second row enable signal RE2.

The structure of memory cell 208 includes variable, bi-directional resistive elements 274, 276, and N-channel transistors 278, 280, 282, 284. Resistive element 274 is coupled in series with transistor 278, and resistive element 276 is coupled in series with transistor 280. Resistive element 274 and transistor 278 are coupled in parallel to resistive element 276 and transistor 280 and connected at a high supply terminal (HST) node. Transistor 278 has a drain electrode coupled to a first terminal of resistive element 274, a source electrode coupled to Vss and a gate electrode coupled to a drain electrode of transistor 280. Transistor 280 has a drain electrode coupled to a first terminal of resistive element 276, a source electrode coupled to Vss and a gate electrode coupled to a drain electrode transistor 278.

Pass transistor 282 has a drain electrode coupled to second bit line BL2, a gate electrode coupled to second word line WL2, and a source electrode coupled to the drain electrode of transistor 278. Pass transistor 284 has a drain electrode coupled to second complementary bit line BLB2, a gate electrode coupled to a second word line WL2, and a source electrode coupled to the drain electrode of transistor 280.

N-channel transistor 270 is coupled to memory cell 208 and is used to control current through resistive elements 274 and 276. N-channel transistor 270 has a drain electrode coupled to a high voltage source V-HI, a source electrode coupled to a first terminal of resistive element 274, and a gate electrode coupled to a second row enable signal RE2.

P-channel transistor 272 is coupled to memory cell 208 and is used to control current through resistive elements 274 and 276. P-channel transistor 272 has a source electrode coupled to a low voltage source V-LO, a drain electrode coupled to a first terminal of resistive element 276, and a gate electrode coupled to a second row enable signal RE2.

Resistive elements 214, 216, 234, 236, 254, 256, 274 and 276 are bi-directional, bistable or switchable, non-volatile resistive memory elements that use an opposite polarity bias when switching from high-to-low versus from low-to-high resistive state. Examples of resistive elements that are suitable for use in cells 202-208 include Spin-Transfer-Torque MRAM (STT-MRAM) and some types of Resistive RAMs (RRAMs), among others. Resistive elements 214, 216, 234, 236, 254, 256, 274 and 276 act as loads on respective memory cells 202-208. BL1, BL2, BLB1, BLB2, VSS, WL1 and WL2 operate similar to a conventional SRAM during read and write. Some types of resistive elements 214, 216, 234, 236, 254, 256, 274 and 276 can be switched from a first state to a second state and vice versa using current, while other types of resistive elements 214, 216, 234, 236, 254, 256, 274 and 276 can be switched from a first state to a second state and vice versa using voltage.

To prevent disturbance during read and write operations, and extra current drain from unselected cells along the same column, transistors 210, 212, 230, 232, 250, 252, 270, 272 can optionally be coupled to respective memory cells 202-208 so that voltage levels VLO and VHI affect only selected cell(s). Voltage supplies VLO and VHI operate like a voltage supply VDD connection in a conventional SRAM during read, but receive a specific bias voltage sequence to write data to the memory cells and to support column selection during write.

During a first phase of a write operation, VHI can be biased at a high value, such as, for example, 1.2 Volts and VSS can be biased at zero Volts (or ground). When a row enable signal REn equals zero Volts, respective resistive elements 214, 216, 234, 236, 254, 256, 274 and 276 are connected to VHI. Selected cross-coupled latch transistors 218/220, 238/240, 258/260, 278/280 are flipped when one or more of bit lines BLn and word lines WLn are at high voltage and the corresponding complementary bit lines BLBn are driven to low voltage.

Figure 3:
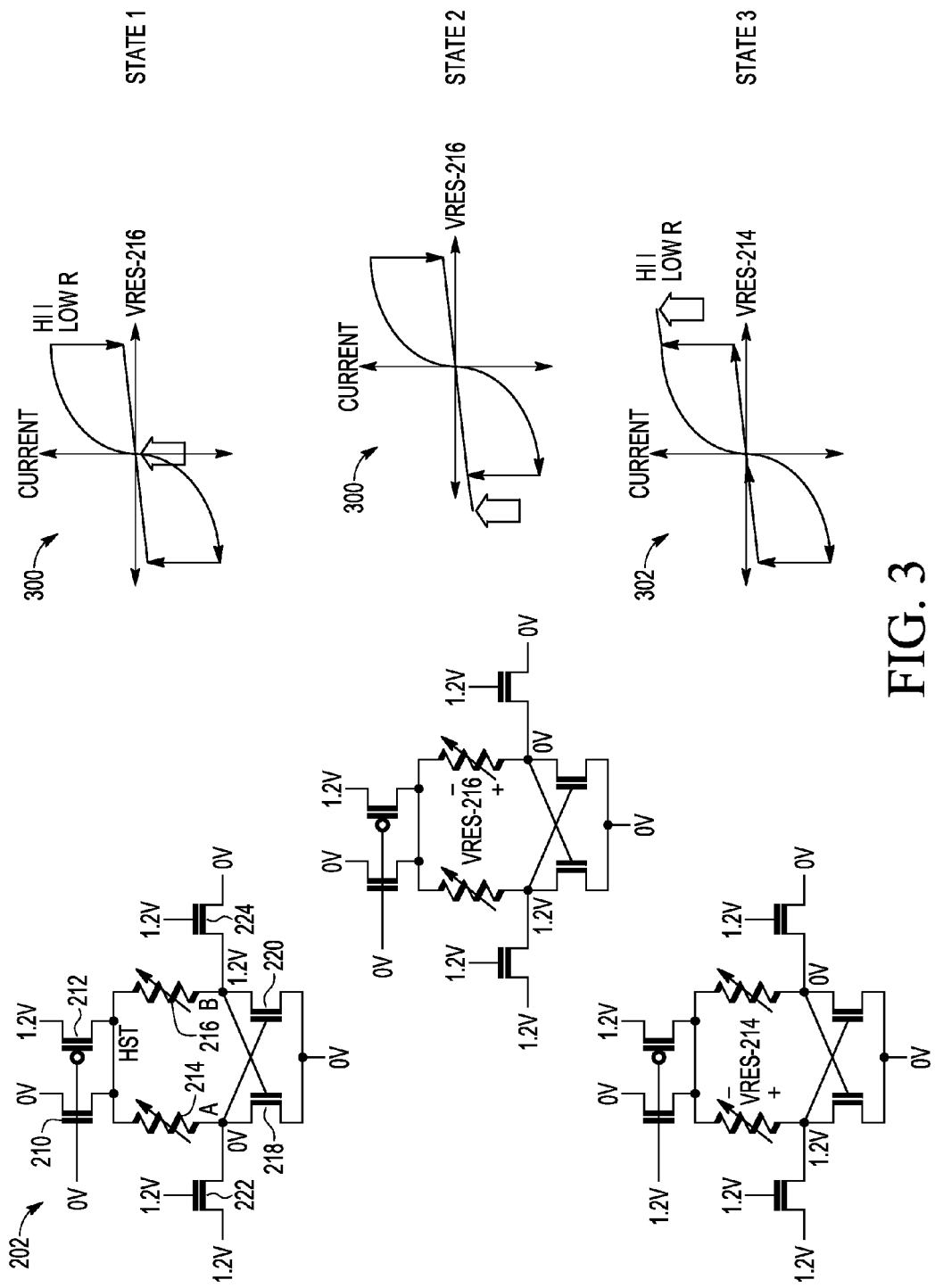
FIG. 3 is a diagram showing states of resistive elements of a memory cell in the memory array of FIG. 2 during a write operation in accordance with one embodiment.

Using memory cell 202 as an example, FIG. 3 is a diagram showing states of resistive elements 214, 216 during a write operation in accordance with one embodiment. A current versus voltage across resistor 216 curve 300 is shown in states 1 and 2 of FIG. 3. A current versus voltage across resistor 214 curve 302 is shown in state 3 of FIG. 3. Before the write operation begins, resistive element 214 is in a high resistance state and resistive element 216 is in a low resistance state. The write operation will first flip the state of the latch transistors 218, 220 in memory cell 202 such that the left-hand storage node (Node A) is now high (eg 1.2V) and the right-hand storage node (Node B) is now low (eg 0V) as shown in state 2. The next step is the resistive element write operation.

At the start of the resistive element write operation, row enable signal RE1 is low (e.g., at zero Volts), which places transistor 212 in a conductive state while transistor 210 is in a non-conductive state. VHI is at high voltage (e.g., 1.2 Volts), VLO is at low voltage (e.g., zero Volts), and VSS is low (e.g., zero Volts). The high voltage is placed across resistive element 216, causing resistor 216 to switch from the low resistance state with high negative current as shown in state 1, to the high resistance state with low negative current as shown in state 2. The first word line WL1 and true/complement bit lines BL1/BLB1 are at high and low voltage biases (e.g., 1.2 Volts and 0 Volts, respectively), allowing current through pass transistor 224 and pull-down transistor 220 to support switching of the resistive element 216 to the high resistance state. Note that resistive element 214 is biased in such a way as to maintain its high resistive state.

The row enable signal RE1 is then set high, causing resistive elements 214 and 216 to be connected to VLO while the biases on the first word line WL1 and true/complement bit lines BL1/BLB1 are maintained to help switch resistive element 214. With row enable signal RE1 set high, the high voltage is applied across resistive element 214, causing resistive element 214 to switch from a high resistance state to a low resistance state, as shown in state 3. Note that resistive element 216 is biased in such as was as to maintain its high resistance state.

The first word line WL1 and true/complement bit lines BL1/BLB1 can be removed and the high voltage at VLO maintained or removed during subsequent operation. When the high voltage at VLO is removed, memory cell 202 will retain data during power-down and power-up due to the high/low resistive states of resistive elements 214, 216. There will be some leakage in memory cell 202 due to the finite impedance of resistor 216 being in the high resistive state, so a low power memory can bring VLO and VHI down to zero Volts during low power states.

Resistors 214, 216 can exhibit non-linear behavior as they switch from one state to another. As shown in FIG. 3, the magnitude of current and voltage across resistors 214, 216 increases monotonically and may not be linear.

Figure 4:
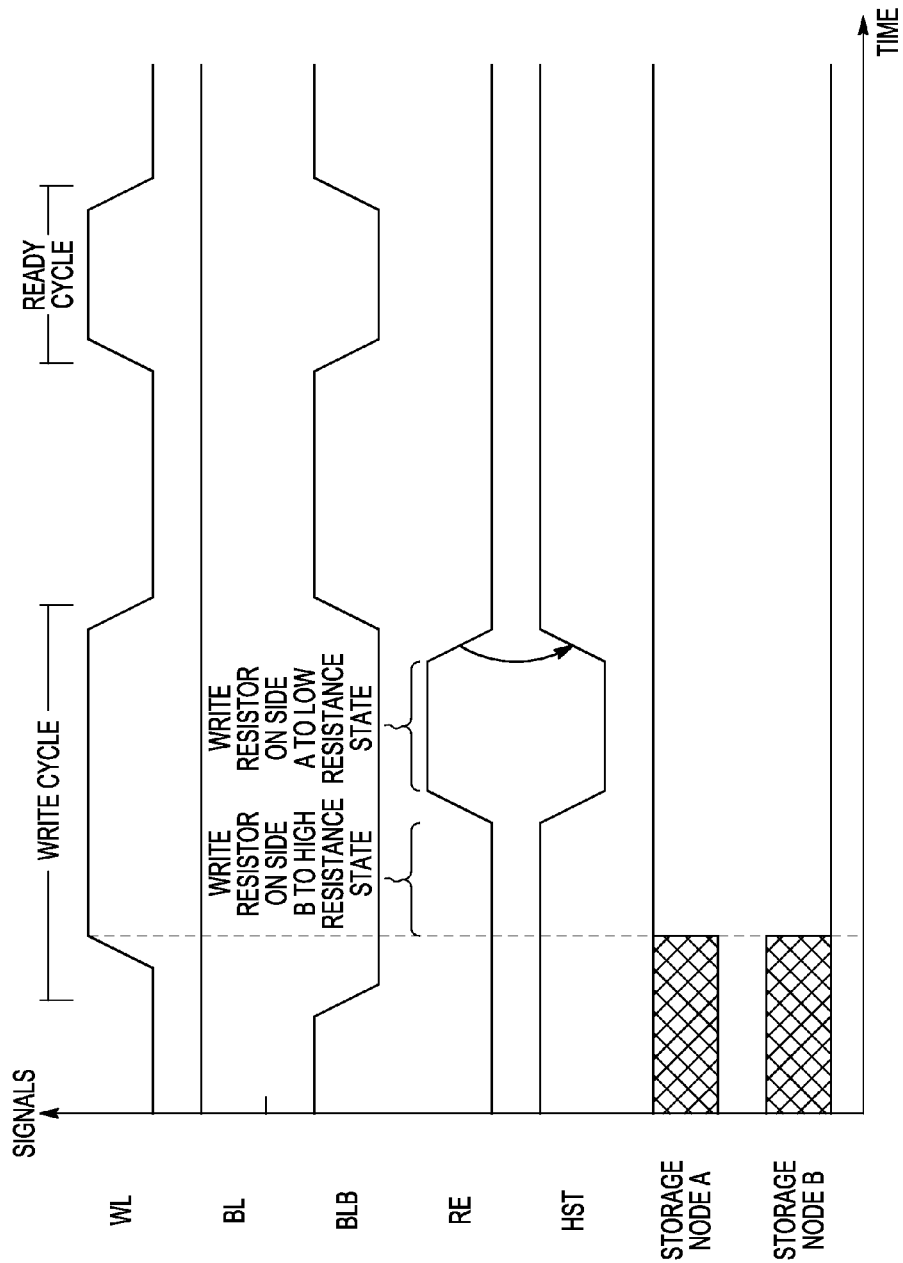
FIG. 4 is a timing diagram showing states of signals in a memory cell that may be used in the memory array of FIG. 2 during write and read operations in accordance with one embodiment.

FIG. 4 is a timing diagram showing states of signals in memory cell 202 that may be used in the memory array of FIG. 2 during write and read operations in accordance with one embodiment. Before the write operation, true/complementary bit lines BL/BLB are precharged to a high voltage, word line WL is biased at low voltage, and the row enable signal RE is at low voltage. At the beginning of a write operation, complementary bit line BLB is driven low and true bit line BL remains high. When the complementary bit line BLB reaches steady state, the word line WL is biased to high voltage, causing the voltage at node A of the memory cell 202 to be high and the voltage at node B of the memory cell 202 to be low. Since RE is set low, node HST is connect to VHI (e.g. 1.2V), and resistive element 216 is biased in such as way as to switch it to a high resistance state. The data is considered to be written in latch transistors 218, 220 and resistor 216 at this point. While the word line WL remains biased at high voltage and the complementary bit line BLB remains biased at low voltage, the row enable signal RE is set high and the HST node is pulled to the VLO supply voltage level (e.g. 0V) through transistor 210, causing resistor 214 to switch to a low resistance state.

After the data is written to latch transistors 218, 220 and resistors 214, 216 have stored a copy of the data, the row enable signal RE is set low, causing the high supply voltage (VHI) to be applied at the HST node. The complementary bit line BLB is precharged to high voltage and the word line WL is biased to low voltage. The voltages at nodes A and B remain latched.

During a read operation, the word line is biased to high voltage and the complementary bit line BLB is pulled to a relatively low voltage through pass transistor 224. The data remains latched at nodes A and B and the differential voltage between the true and complementary bit lines is sensed by sense amplifiers 114 (FIG. 1) to read the data stored by memory cell 202.

Figure 5:
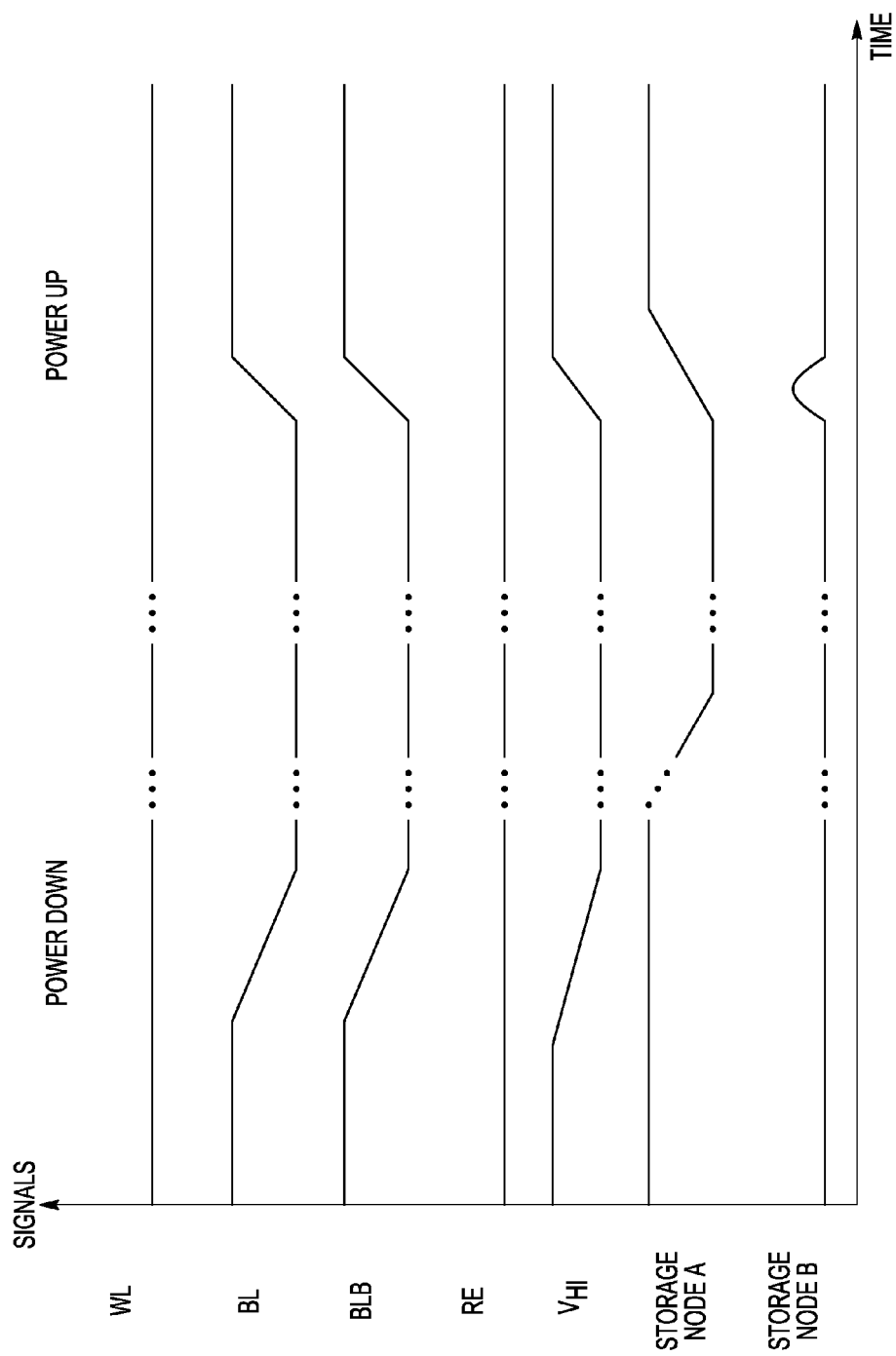
FIG. 5 is a timing diagram showing states of signals in a memory cell that may be used in the memory array of FIG. 2 during power down and power up operations in accordance with one embodiment.

FIG. 5 is a timing diagram showing states of signals in memory cell 202 during power down and power up operations in accordance with one embodiment. At the beginning of the power down phase, the word line WL and row enable signal RE are low, while high voltage VHI (at node HST) and the true/complementary bit lines BL/BLB are high. The high voltage VHI (at node HST) and the true/complementary bit lines BL/BLB are then driven low, causing loss of data stored at node A. The state of the resistors 214, 216 (FIG. 2) remains unchanged, however.

During the power up sequence, as high voltage VHI is applied at node HST, the word line (WL) is held low and true/complementary bit lines BL/BLB are precharged to high, the data stored in resistors 214, 216 is used to restore data at nodes A and B of memory cell 202. Recall that resistor 216 is in a high resistive state while resistor 214 is in a low resistive state. As transistor 212 enters a conductive state, the voltage at storage nodes A and B begins to rise. The voltage at storage node A rises more quickly than the voltage at storage node B because resistor 214 has relatively low resistance, while resistor 216 has relatively high resisitance.

Eventually the positive feedback in the latch reinforces the high and low voltage states at nodes A and B. The state of memory cell 202 is thus restored to its pre-power-down state.

Figure 6:
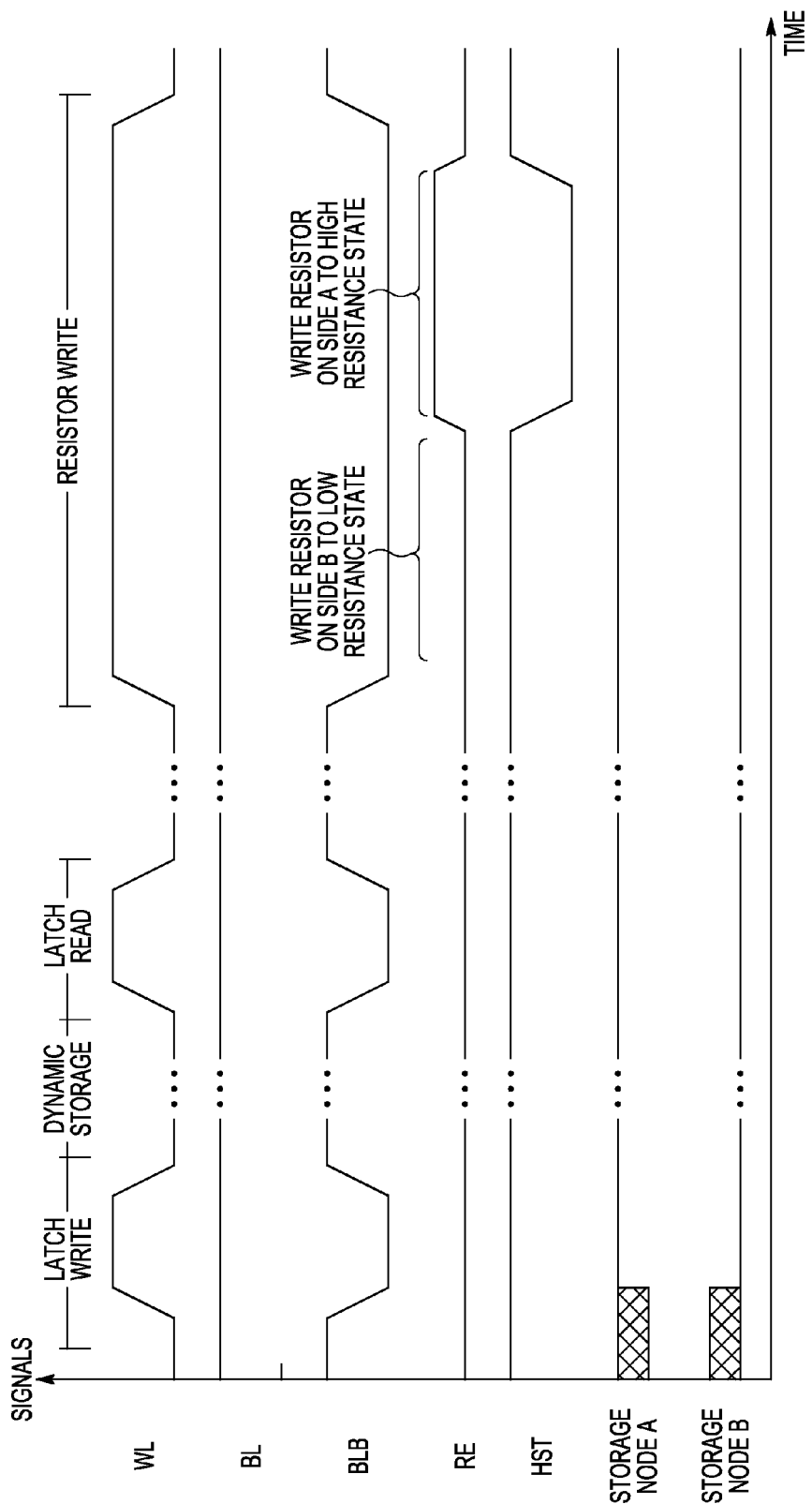
FIG. 6 is a timing diagram showing states of signals in a memory cell that may be used in the memory array of FIG. 2 during latch write, dynamic storage, latch read, refresh, and resistive element write operations in accordance with one embodiment.

FIG. 6 is a timing diagram showing states of signals in memory cell 202 during latch write, dynamic storage, latch read, refresh, and resistive element write operations in accordance with one embodiment. During latch write operation, data is stored at nodes A and B of memory cell 202. In the example shown, high voltage VHI is applied at node HST, the row enable signal RE is low, the word line WL is high, the true bit line BL is precharged to and remains at high voltage, and the complementary bit line BLB is precharged to high voltage and driven to low voltage at the start of the latch write operation. The voltage at node A goes high and the voltage at node B goes low, once the word line WL reaches the high voltage level and the complementary bit line BLB reaches the low voltage level.

Memory cell 202 dynamically retains data by virtue of the capacitances of nodes A and B, but memory cell 202 will need to be periodically refreshed as leakage current in transistor 218 causes the voltage at nodes A and B to gradually dissipate. One way to refresh memory cell 202 is by performing a latch read operation during which the word line WL is driven to high voltage, the true bit line and complementary bit line are precharged at high voltage, the row enable signal RE is low, high voltage VHI is applied at node HST, and storage nodes A and B retain their respective data states. During the read operation, the differential voltage between the true and complementary bit lines is driven to its full rail-to-rail value and causes data at storage nodes A and B to be refreshed.

As further shown in FIG. 6, another operation that can be performed on memory cell 202 is a resistor write operation where data stored at nodes A and B is "written" to respective resistors 214 and 216 by flipping resistors 214, 216 to opposite states. In the example shown, during a resistor write operation, high voltage VHI is applied at node HST, the row enable signal RE is initially at low voltage, the word line WL transitions from low to high voltage, the true bit line BL is precharged to and remains at high voltage, and the complementary bit line BLB is driven from a precharged high voltage and to low voltage at the start of the resistor write operation. Typically, a latch read operation (not shown) would be used to select the appropriate bit lines (BL and BLB) to be driven to the high voltage (BL in this example) and the low voltage (BLB in this example). The resistance of resistor 216 transitions from low to high due to the high level of voltage/current. Once data at node B is "written" to resistor 216, the row enable signal RE transitions to high voltage, causing transistor 210 to enter a conductive state while transistor 212 enters a nonconductive state. Resistor 214 transitions from high resistance to low resistance as the data at node A is "written" to resistor 214 as current is conducted through resistor 214 due to the high voltage at node A and the low voltage at node HST.

Figure 7:
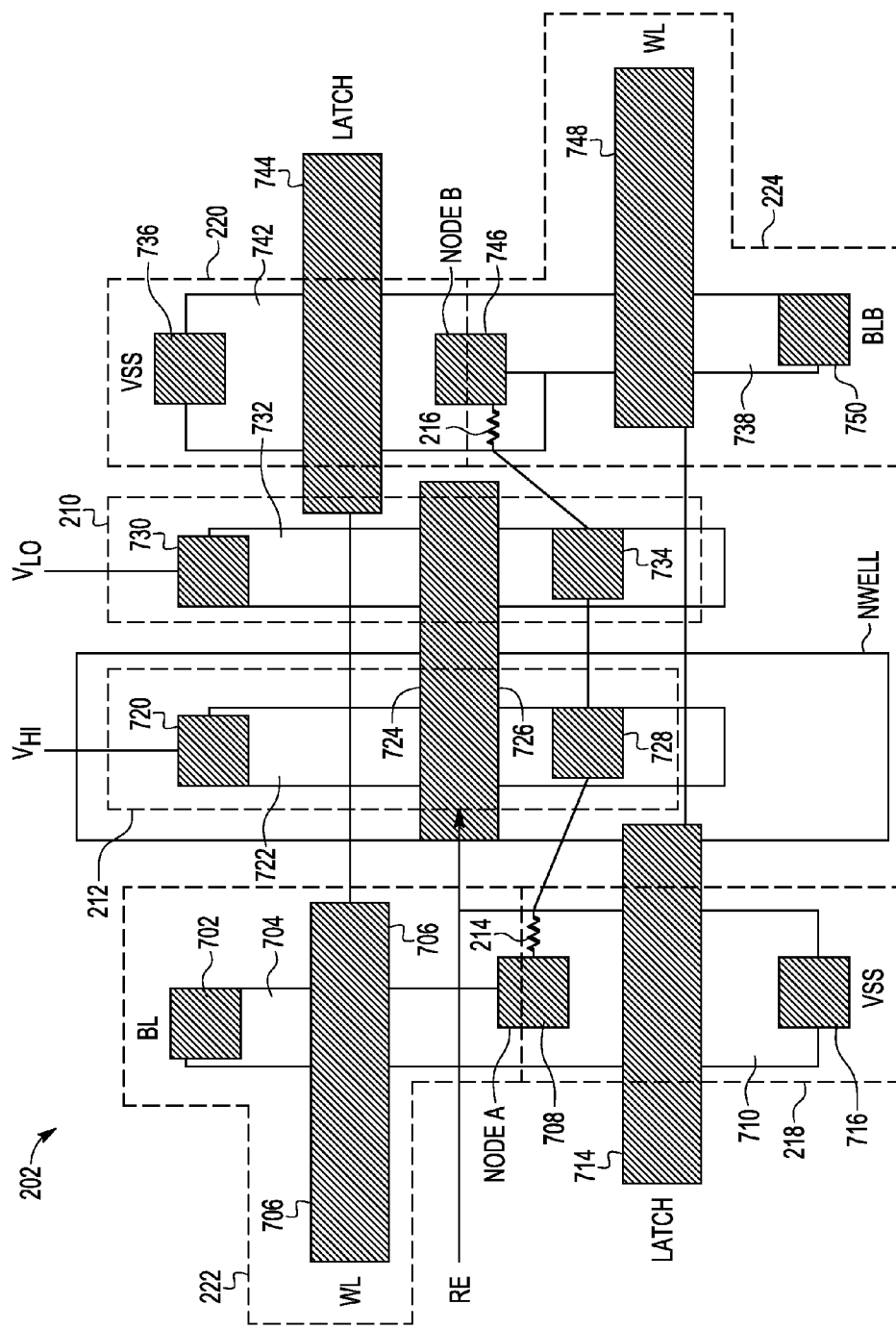
FIG. 7 is a layout diagram of a memory cell that may be used in the memory array of FIG. 2.

FIG. 7 is a layout diagram of memory cell 202 that may be used in the memory array 106 of FIG. 2. Transistors 210, 212, 218, 220, 222, 224 are shown with respective source/drain regions 704, 710, 722, 732, 738, 742, electrodes 702, 708, 716, 720, 728, 730, 734, 736, 746, 750, and gate electrodes 706, 714, 724, 744, 748. Resistive element 214 is coupled between a source region of transistors 210 and 212, and a drain region of transistor 218. Resistive element 216 is coupled between a drain region of transistors 210 and 212 and a drain region of transistor 220.

Transistor 212 includes contact or electrode 720 in contact with source/drain region 722, gate electrode 724 overlaid on source/drain region 722, and electrode 728 in contact with source/drain region 722. Electrode 720 couples the high voltage source VHI to a source region of transistor 212. Electrode 728 couples a drain region of transistor 212 to one end of resistor 214, and to electrode 734.

Transistor 210 includes contact or electrode 730 in contact with source/drain region 732, gate electrode 724 overlaid on source/drain region 732, and electrode 734 in contact with source/drain region 732. Electrode 730 couples the low voltage source VLO to a source region of transistor 210. Electrode 734 couples a drain region of transistor 210 to one end of resistor 216, and to electrode 728. The connection between electrodes 728 and 724 forms a common node that corresponds to the HST node in FIG. 2.

Transistor 222 includes contact or electrode 702 in contact with source/drain region 704, gate electrode 706 overlaid on source/drain region 704, and electrode 708 in contact with source/drain region 704. Electrode 702 couples the true bit line BL to a source/drain region of transistor 222. Electrode 708 corresponds to node A and couples a source/drain region of transistor 222 and a drain region of transistor 218 to one end of resistor 214. Electrode 716 couples the source region of transistor 218 to VSS.

Transistor 218 includes electrode 708 in contact with source/drain region 710, gate electrode 714 overlaid on source/drain region 710, and electrode 716 in contact with source/drain region 710.

Transistor 220 includes contact or electrode 736 in contact with source/drain region 742, gate electrode 744 overlaid on source/drain region 742, and electrode 746 in contact with source/drain region 742. Electrode 736 couples the source region of transistor 220 to VSS.

Transistor 224 includes electrode 750 in contact with source/drain region 738, gate electrode 744 overlaid on source/drain region 738, and electrode 746 in contact with source/drain region 738. Electrode 750 couples the complementary bit line BLB to a source/drain region of transistor 738. Electrode 746 corresponds to node B and couples a source/drain region of transistor 224 and a drain region of transistor 220 to one end of resistor 216.

The word line WL is coupled to gate electrode 706 of transistor 222 and gate electrode 748 of transistor 224.

Notably, the layout area requirements for cell 202 is comparable to the area required for a conventional SRAM cell while providing the robustness of differential read operations, and nonvolatility. Memory cell 202 can be used in extremely low power modes since the resistors 214, 216 retain the data while not powered, and thus do not draw leakage current.

Figure 8:
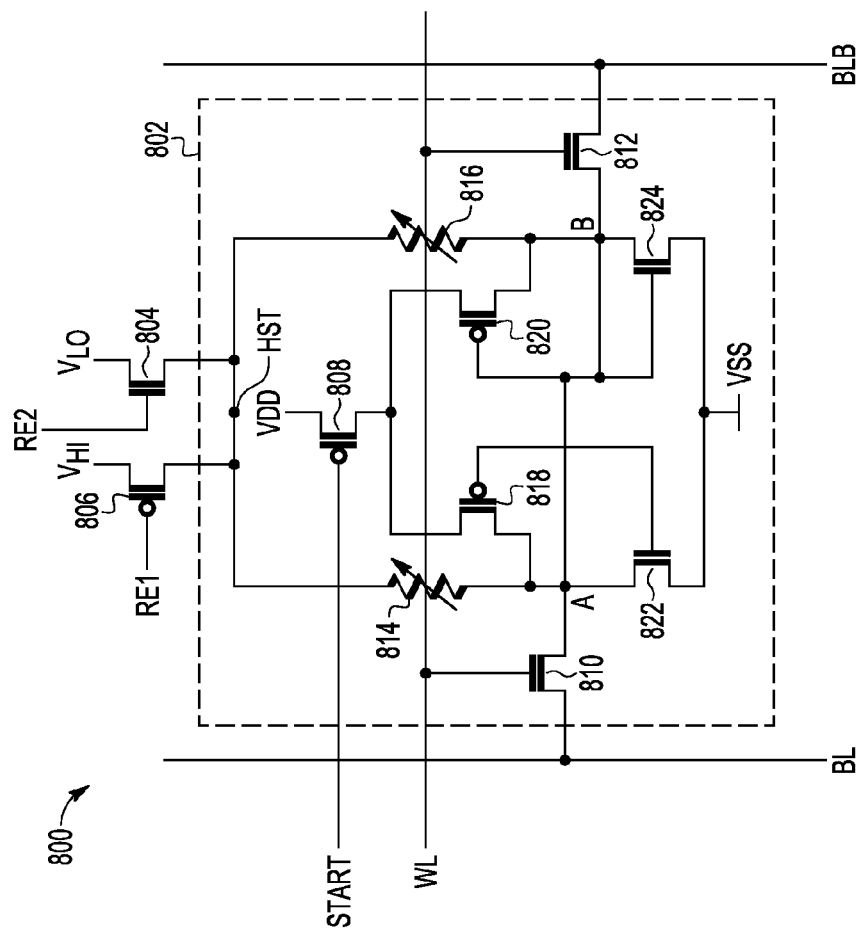
FIG. 8 is a schematic diagram of another embodiment of a memory cell that may be used in the memory array of FIG. 1.

FIG. 8 is a schematic diagram of another embodiment of a memory device 800 that includes memory cell 802 and biasing transistors 804, 806 that may be used in the memory array 106 of FIG. 1. Biasing transistor 804 is an N-channel transistor that is used to control current through resistive elements 814 and 816. Transistor 804 has a drain electrode coupled to a low voltage source VLO, a source electrode coupled to a first terminal of resistive elements 814 and 816 at node HST, and a gate electrode coupled to a first row enable signal RE1.

Isolation transistor 806 is a P-channel transistor that is used to control current through resistive elements 814 and 816. Transistor 806 has a source electrode coupled to a high voltage source VHI, a drain electrode coupled to a first terminal of resistive elements 814 and 816 at node HST, and a gate electrode coupled to a second row enable signal RE2.

Memory cell 802 is a six transistor SRAM cell with a first resistive element 814 coupled between the HST node and N-channel transistor 822 and a second resistive element 816 coupled between the HST node and N-channel transistor 824. A first inverter including N-channel transistor 822 and P-channel transistor 818 is cross-coupled to a second inverter that includes N-channel transistor 824 and P-channel transistor 820. Source electrodes of P-channel transistors 818, 820 are coupled to a high voltage supply VDD. Source electrodes of N-channel transistors 822, 824 are coupled to VSS. The drain electrodes of P-channel transistors 818, 820 are coupled to source electrodes of respective N-channel transistors 822, 824 at respective nodes A and B. The gate electrodes of N-channel transistor 822 and P-channel transistor 818 are coupled to the output of the second inverter. The gate electrodes of N-channel transistor 824 and P-channel transistor 820 are coupled to the output of the first inverter. Pass transistor 810 is coupled between true bit line BL and node A and pass transistor 812 is coupled between complementary bit line BLB and node B. Gate electrodes of pass transistors 810, 812 are coupled to word line WL.

During operation, data is written to memory cell 802 in the same manner as a convention SRAM cell where the true and complementary bit lines are precharged to a high voltage level, and then one of the complementary bit lines (BLB, for example) is pulled low, and a word line is asserted to latch data at nodes A and B through the operation of the cross-coupled inverters. When the write operation is completed, the word line WL is set low, and memory cell 802 stores the new data which was loaded during the write operation.

To program the pair of resistive elements 814, 816, data is read from memory cell 802 and latched, so the true and complementary bit lines BL and BLB can be actively biased with the read data. In this example, BL is the high voltage state and BLB is the low voltage state. The WL is then biased to high voltage and the row enable signals RE1 and RE2 are pulsed low. During this first row enable pulse, resistive element 816 is programmed to match the data at node B. During a second row enable pulse, row enable signals RE1 and RE2 are pulsed high so resistive element 814 is programmed to match the data at node A. P-channel transistors 818, 820 also help maintain a proper bias on each resistive element 814, 816.

Upon startup, RE1 can be held at 0V while RE2 is first held at Vdd, to ensure that node HST is grounded and no unwanted data is established in the cell. The true and complementary bit lines BL/BLB are set to high voltage, the word line WL is held at low voltage. RE2 is now brought to low voltage, turning on transistor 806 and allowing HST to be biased to Vdd. The differential resistances of resistive elements 814 and 816 will now restore proper data to memory cell 202.

Figure 9:
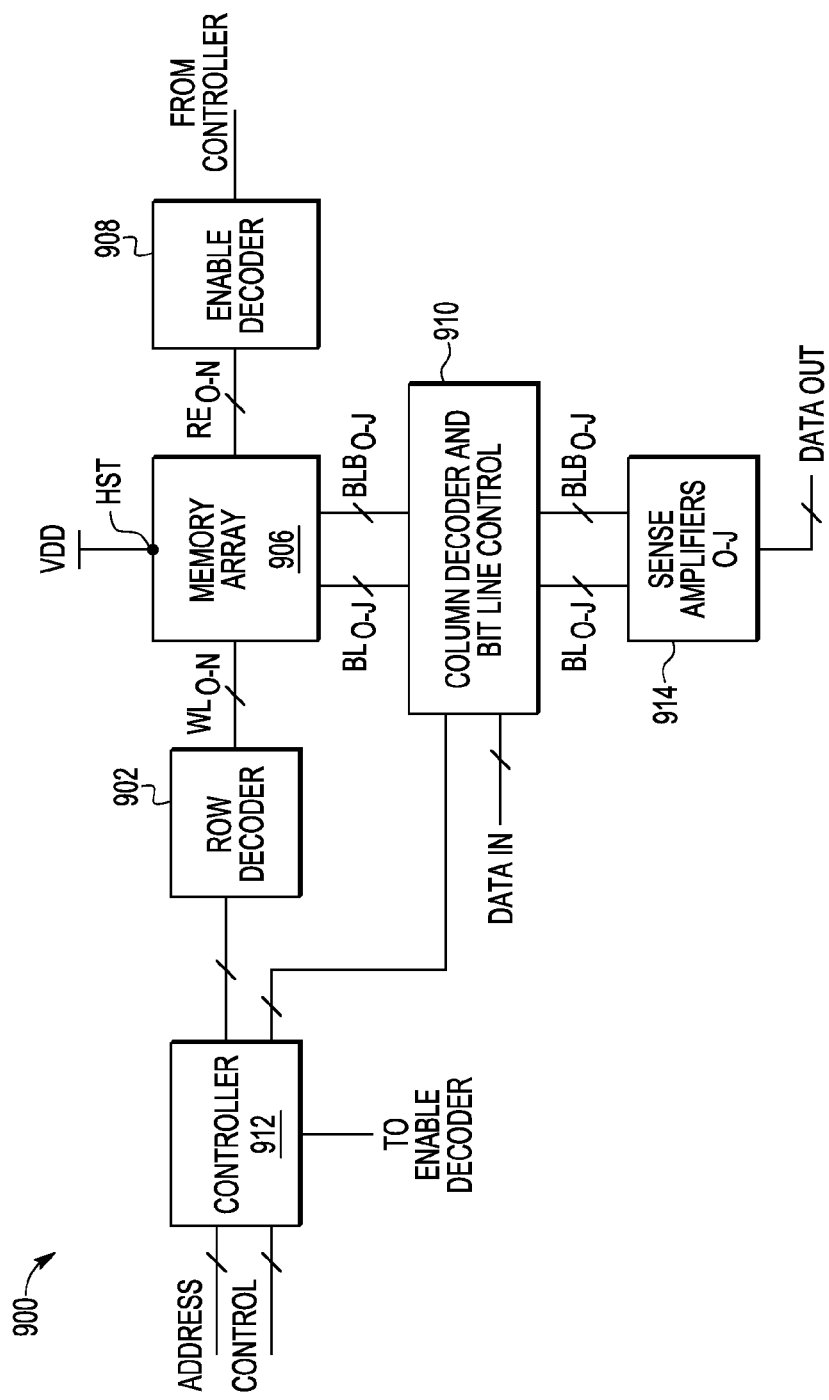
FIG. 9 is a block diagram of an integrated circuit device including a non-volatile memory (NVM) according to another embodiment.

FIG. 9 is a block diagram of an integrated circuit device 900 including a non-volatile memory (NVM) according to another embodiment. NVM device 900 includes NVM array 906 coupled to controller 912, row decoder 902, VDD at node HST, row enable decoder 908, and column decoder and bit line control 910. Sense amplifiers 914 are coupled to column decoder and bit line control 910. Controller 912 receives address and control signals from a processor and is coupled to row decoder 902 and column decoder and bit line control 910. Data to be written to memory array 906 is provided from a processor to column decoder and bit line control 910. Word lines $WL_{0-N}$ are coupled between row decoder 902 and memory array 906.

NVM controller 912 controls program and erase procedures of the NVM array 906 through row decoder 902 and column decoder and bit line control 910, such as in response to one or more processors. NVM controller 912 accesses memory cells within NVM array 906 by providing a row address to the row decoder 902 and a column address to column decoder and bit line control 910. Data is written into or read from the NVM array 906 via column decoder and bit line control 910. Row enable decoder 908 receives address information from controller 912 and provides row enable signals to memory array 906.

True bit lines $BL_{0-J}$ and complementary bit lines $BLB_{0-J}$ are coupled between memory array 906 and column decoder and bit line control 910, and between sense amplifiers 914 and column decoder and bit line control 910. Sense amplifiers 914 provide data from memory array 906 to one or more processors.

NVM device 900 may be implemented as part of a System On Chip (SOC) or the like which includes at least one processor (not shown) coupled to the NVM device 900 via an appropriate interface (not shown), such as a bus or the like with multiple signals or bits. The integrated circuit device may include other circuits, modules or devices, such as other memory devices (not shown), other functional modules (not shown), and external interfaces, such as input, output or input/output (I/O) ports or pins or the like (not shown). In one alternative embodiment, the NVM device 900 is implemented alone in an integrated circuit without any other devices. In another alternative embodiment, NVM device 900 is part of a larger system on the integrated circuit.

Figure 10:
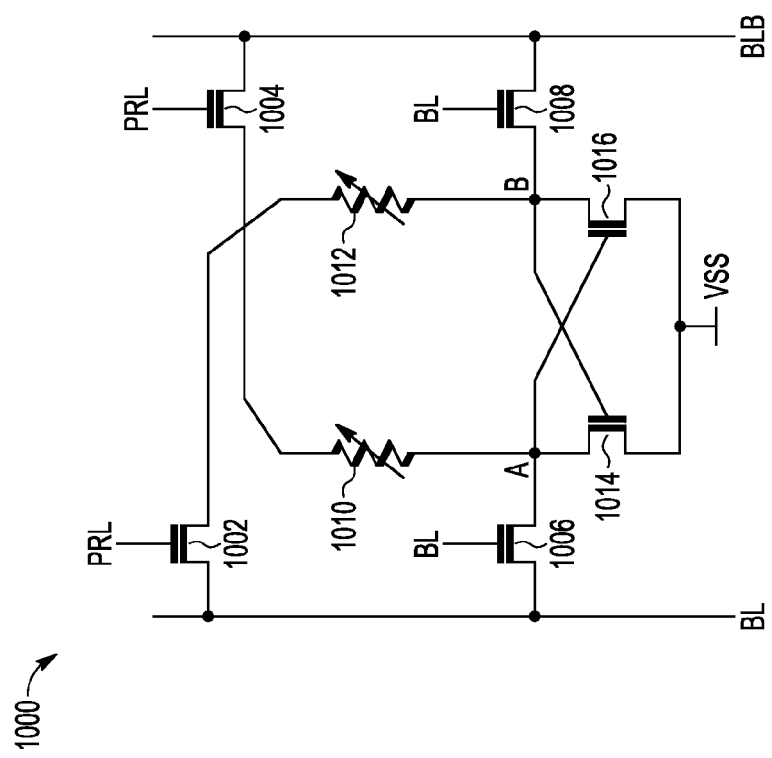
FIG. 10 is a schematic diagram of an embodiment of a memory cell that may be used in the memory array of FIG. 9.

FIG. 10 is a schematic diagram of an embodiment of a memory cell 1000 that may be used in memory array 906 of the NVM device 900 of FIG. 9. Memory array 906 can include any suitable number of memory cells 1000 and any suitable number of rows and columns.

The structure of memory cell 1000 includes variable, bi-directional resistive elements 1010, 1012, and N-channel transistors 1002, 1004, 1006, 1008, 1014, 1016. Resistive element 1010 is coupled in series with transistor 1014 at Node A, and resistive element 1012 is coupled in series with transistor 1016 at Node B. Resistive element 1010 and transistor 1014 are coupled in parallel to resistive element 1012 and transistor 1016. Transistor 1014 has a drain electrode coupled to a first terminal of resistive element 1010, a source electrode coupled to supply voltage VSS and a gate electrode coupled to a drain electrode of transistor 1016. Transistor 1016 has a drain electrode coupled to a first terminal of resistive element 1012, a source electrode coupled to supply voltage VSS and a gate electrode coupled to a drain electrode transistor 1014. Resistive elements 1010 and 1012 each have a fixed orientation between the anode and the cathode, as is designated by the diagonal arrows. Note that the same terminal type of each resistive element are connected to transistors 1002 and 1004, to ensure proper operation during resistive element write operations.

Pass transistor 1006 has a drain electrode coupled to first bit line BL, a gate electrode coupled to first word line WL, and a source electrode coupled at Node A to the first terminal of resistive element 1010 and the drain electrode of transistor 1014. Pass transistor 1008 has a drain electrode coupled to first complementary bit line BLB, a gate electrode coupled to a first word line WL, and a source electrode coupled at Node B to the first terminal of resistive element 1012 and the drain electrode of transistor 1016.

N-channel transistor 1002 has a drain electrode coupled to bit line BL, a source electrode coupled to a second terminal of resistive element 1012, and a gate electrode coupled to a program refresh line (PRL) signal.

N-channel transistor 1004 has a drain electrode coupled to complementary bit line BLB, a source electrode coupled to a second terminal of resistive element 1010, and a gate electrode coupled to the PRL signal. During operation, transistors 1006, 1008, 1014 and 1016 form a four-transistor DRAM latch memory cell. The bit lines BL and BLB, supply voltage VSS, and the word line are operated similarly to a conventional SRAM during read and write, allowing single-clock read/write in the range of, for example, a one nanosecond cycle time. After data is written normally to the latch memory cell, the PRL signal can be used to program data in to the pair of resistive elements 1010, 1012. Data can be refreshed between the time of writing and the successful completion of programming data to the resistive elements 1010, 1012.

Figure 11:
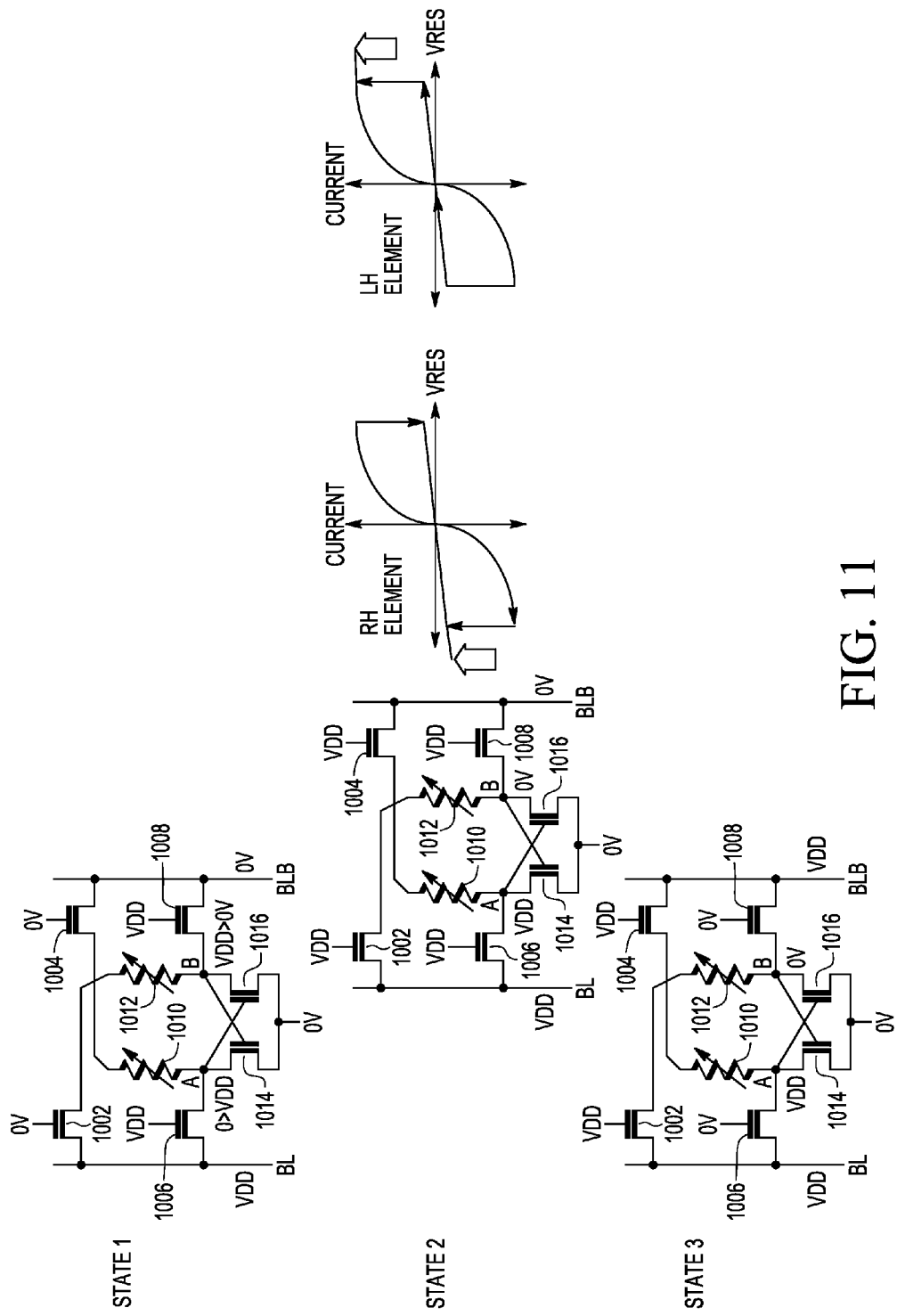
FIG. 11 is a diagram showing states of resistive elements of the memory cell of FIG. 10 during a write operation in accordance with one embodiment.
Figure 12:
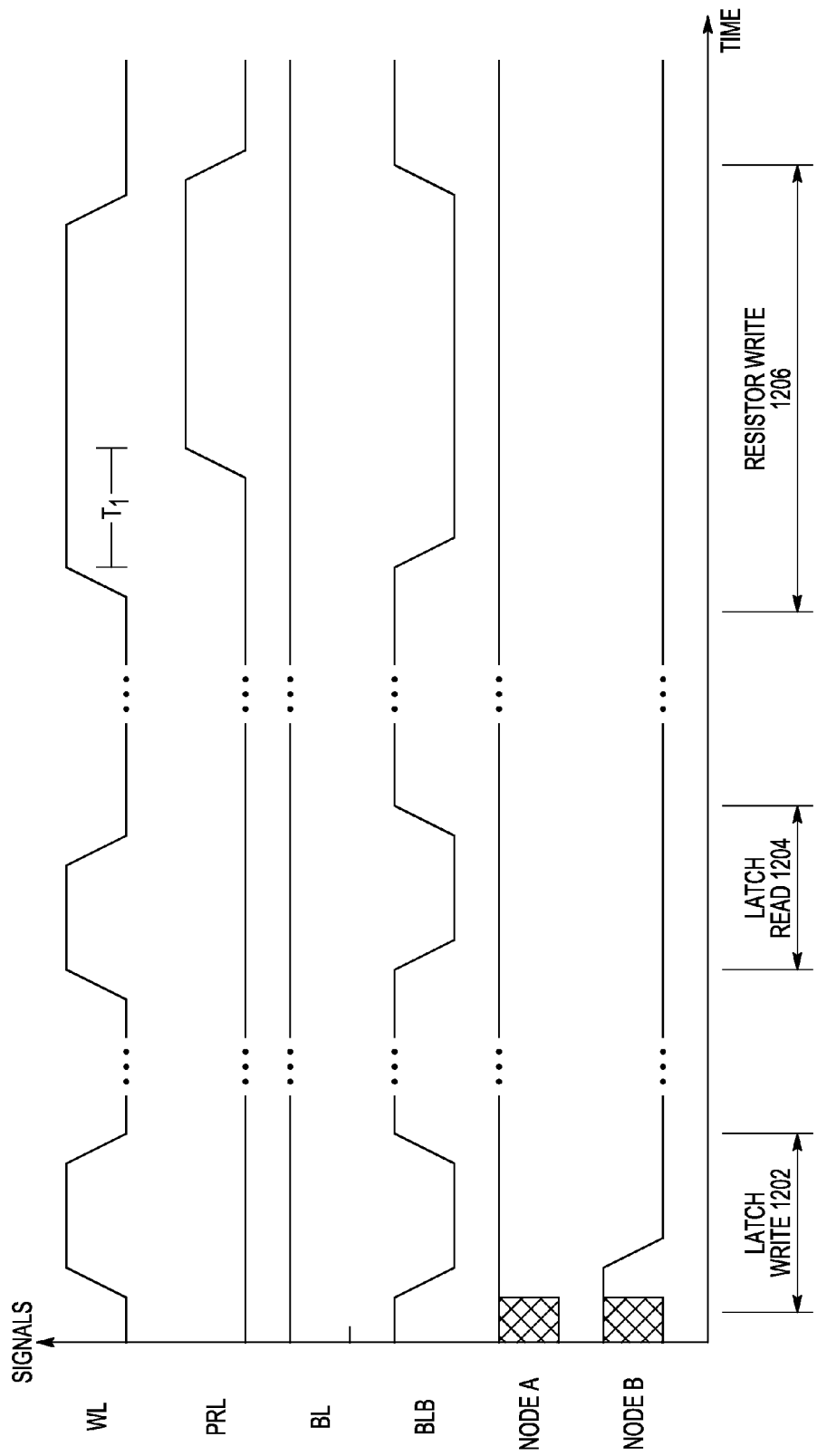
FIG. 12 is a timing diagram showing states of signals in the memory cell of FIG. 10 during latch write, resistive element write, and latch read operations in accordance with one embodiment.

Referring to FIGS. 11 and 12, FIG. 11 is a diagram showing states of resistive elements 1010, 1012 of the memory cell 1000 of FIG. 10 during write operations to the latch and the resistive elements in accordance with one embodiment. In state 1, data is written to the latch portion of cell 1000 similar to a conventional SRAM or four transistor (4T) DRAM. The latch portion of cell 100 includes transistors 1006, 1008, 1014, and 1016. FIG. 12 shows an example of states of various signals in cell 1000 during latch write operation 1202. In the example shown, the write data is the complement of existing data state in the cell 1000, flipping the cross-coupled latch at Node B from high to low as the word line is asserted, the true bit line (BL) remains biased high, and the complementary bit line (BLB) is held at ground or VSS. Resistive elements 1010, 1012 are floating since the PRL signal is low. Since resistive elements 1010, 1012 may require longer than the available write cycle to switch, the cell 1000 can periodically be refreshed by reading and re-writing as with a conventional 4T DRAM. To 'hide' the write latency, the cell 1000 can function as a DRAM until cycles are available to program the resistive elements 1010, 1012.

To read or refresh the data in the cell, the cell is biased as shown in a Latch Read Section 1204 of FIG. 12. During the latch read operation, the word line transitions to VDD, the true bit line is pulled and then actively biased to VDD, and the complementary bit line is pulled and then actively biased to ground or VSS. The PRL signal remains biased to ground or VSS. Existing data is thus reinforced at Nodes A and B. After the data is read and the word line transitions to Vss, the complementary bit line transitions from ground or VSS to supply voltage VDD.

In state 2 in FIG. 11, to program the resistive elements 1010, 1012, the latch portion of cell 1000 is first read as shown in the left-hand portion (labeled T1) of the Resistor Write Section 1206 of FIG. 12. The biasing during T1 is the same as Section 1204, resulting in a latch read operation. To begin the resistor write operation once the latch read operation is complete (after T1), the true bit line remains biased to VDD, the word line is biased to supply voltage VDD, and the complementary bit line is biased to VSS or ground to re-write the data. The PRL signal is then pulsed to VDD, turning on transistor 1004 to place sufficient voltage across the resistive element 1010, switching it from a high resistive state to a low resistive state. N-channel transistor 1002 is also turned on, placing sufficient voltage across resistive element 1012 and causing it to switch from a low resistive state to a high resistive state. Note that the biasing of BL and BLB after the latch read operation is naturally of the correct polarity to cause the correct transitions of bidirectional resistive elements 1010 and 1012.

In state 3, the cell 1000 will now store data when power is removed. Cell 1000 can be periodically refreshed like a DRAM, by biasing both bit lines to VDD, keeping the word line at VDD or ground, and pulsing the PRL signal such that both resistors 1010, 1012 are tied to respective bit lines BL/BLB. Since the resistive element 1012 has more resistance than resistive element 1010, for example, at least ten times the resistance of resistive element 1010, Node A will be pulled high. This method can be used upon startup to restore data to the latch.

Figure 13:
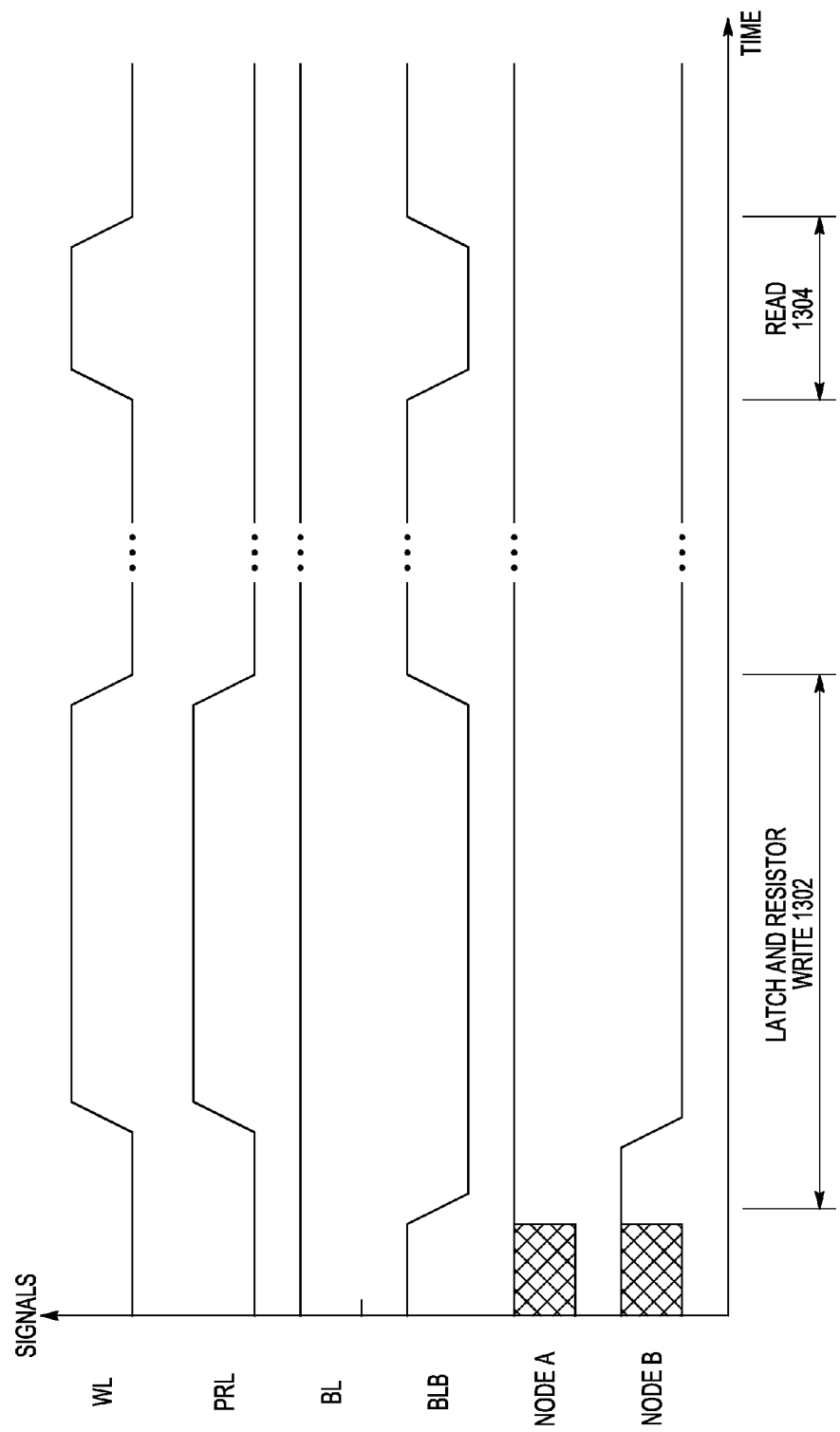
FIG. 13 is a timing diagram showing states of signals in the memory cell of FIG. 10 during latch write, resistive element write and read, in accordance with one embodiment.

FIG. 13 is a timing diagram showing states of signals in the memory cell of FIG. 10 during a combined latch and resistive element write operation 1302, and during a latch read operation 1304 in accordance with one embodiment. To program the resistive elements 1010, 1012, and the latch portion of cell 1000, the word line and the true bit line are biased to VDD while the complementary bit line transitions from being biased at supply voltage VDD to ground or VSS. The PRL signal is asserted to place sufficient voltage across the resistive elements 1010 and 1012, switching them respectively from a high resistive state to a low resistive state, and from a low resistive state to a high resistive state. Data is latched and the word line and PRL signal are de-asserted and the complementary bit line is biased to supply voltage VDD. The true bit line remains biased as supply voltage throughout the operation 1302.

During the read operation 1304, the word line is asserted, the true bit line remains biased to VDD, and the complementary bit line is pulled toward Vss or ground through access transistor 1008. The PRL signal remains biased to ground or VSS. Data remains intact at Nodes A and B. After the data is read, word line is de-asserted the complementary bit line is again precharged to supply voltage VDD. The combined resistor/latch write operation can be used when the read cycle is long enough to complete the resistor write operation (e.g., 10-100 nsec, depending on the resistive element technology). When this much time is available, the combined write operation makes for a simple memory operation scheme similar to conventional memories.

Figure 14:
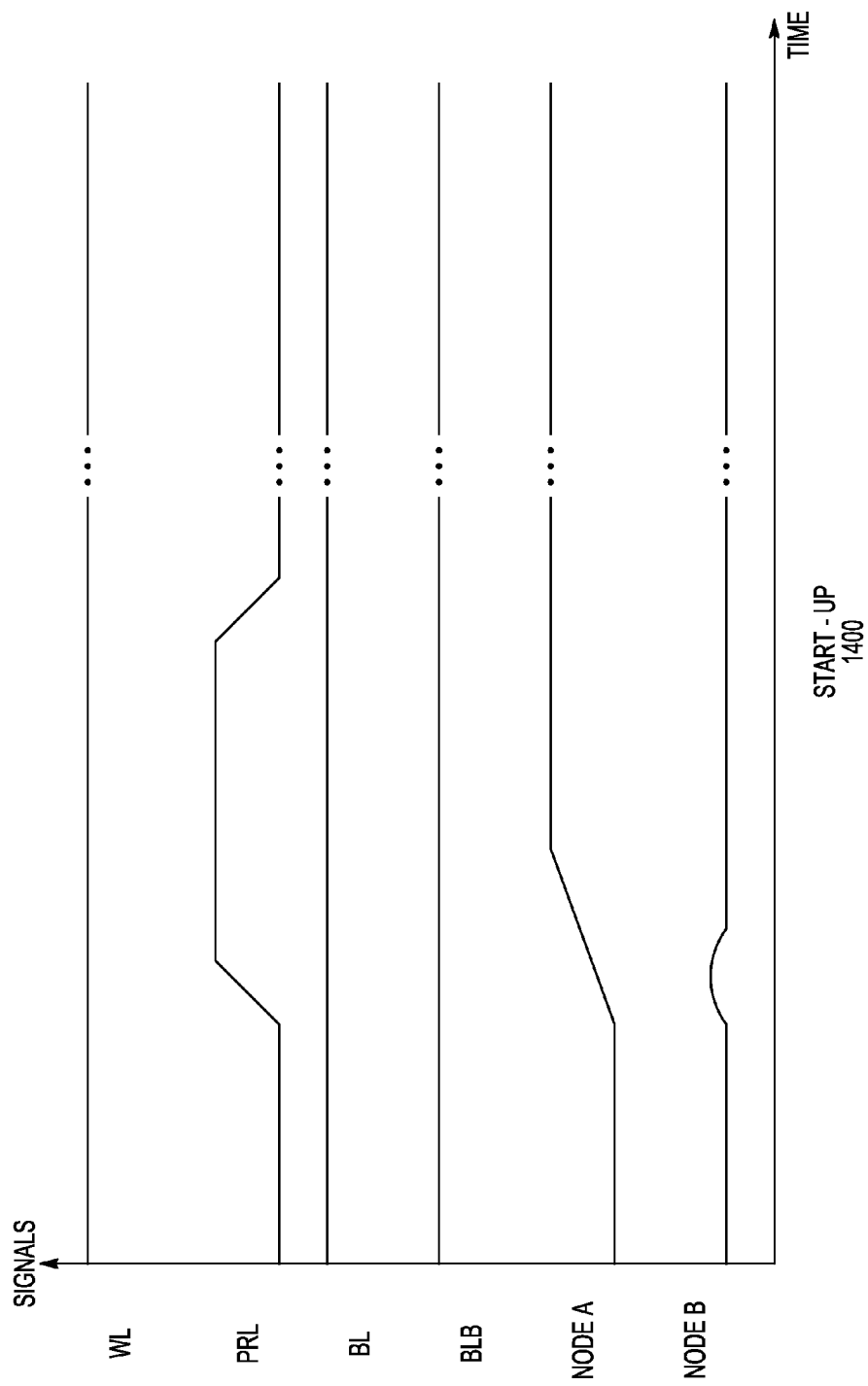
FIG. 14 is a timing diagram showing states of signals in the memory cell of FIG. 10 during start up operation in accordance with one embodiment.

Referring to FIGS. 10 and 14, FIG. 14 is a timing diagram showing states of signals in the memory cell of FIG. 10 during start up operation 1400 in accordance with one embodiment. Cell 1000 stores data in resistive elements 1010, 1012 when power is removed. Upon start-up, data in resistive elements 1010, 1012 can be written to the latch portion of cell 1000 by biasing both bit lines to VDD, keeping the word line at zero Volts, and pulsing the PRL signal such that both resistors 1010, 1012 are tied to respective bit lines BL/BLB. The data from resistor 1010 is written at Node A and the data from resistor 1012 is written at Node B.

Figure 15:
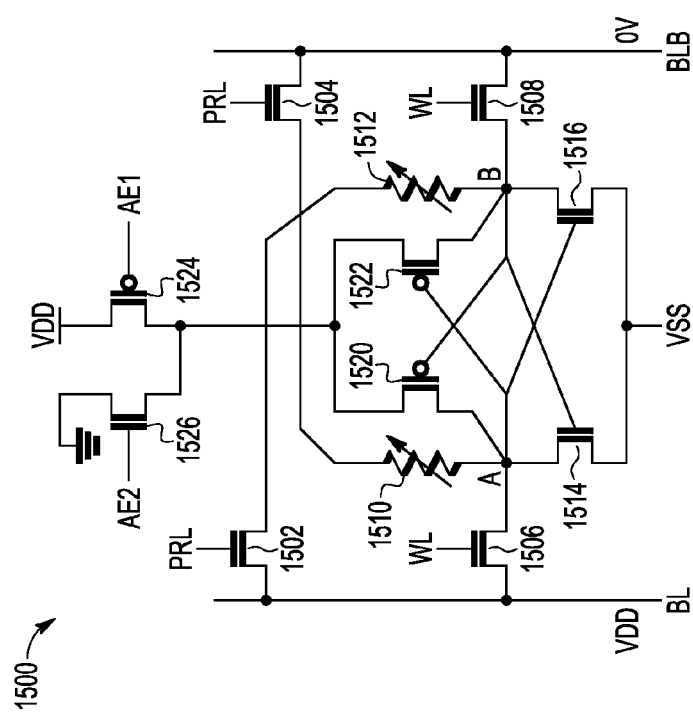
FIG. 15 is a schematic diagram of another embodiment of a memory cell that may be used in the memory array of FIG. 9.

FIG. 15 is a schematic diagram of another embodiment of a memory cell 1500 that may be used in the memory array 906 of FIG. 9. Memory array 906 can include any suitable number of memory cells 1500 and any suitable number of rows and columns.

The structure of memory cell 1500 includes variable, bi-directional resistive elements 1510, 1512, N-channel transistors 1502, 1504, 1506, 1508, 1514, 1516, 1526, and P-channel transistors 1520, 1522 and 1524. Resistive element 1510 is coupled in series with transistor 1514 at Node A, and resistive element 1512 is coupled in series with transistor 1516 at Node B. Resistive element 1510 and transistor 1514 are coupled in parallel to resistive element 1512 and transistor 1516. Transistor 1514 has a drain electrode coupled to a first terminal of resistive element 1510, a source electrode coupled to supply voltage VSS and a gate electrode coupled to a drain electrode of transistor 1516. Transistor 1516 has a drain electrode coupled to a first terminal of resistive element 1512, a source electrode coupled to supply voltage VSS and a gate electrode coupled to a drain electrode transistor 1514.

Pass transistor 1506 has a drain electrode coupled to bit line BL, a gate electrode coupled to word line WL, and a source electrode coupled at Node A to the first terminal of resistive element 1510 and the drain electrode of transistor 1514. Pass transistor 1508 has a drain electrode coupled to first complementary bit line BLB, a gate electrode coupled to a first word line WL, and a source electrode coupled at Node B to the first terminal of resistive element 1512 and the drain electrode of transistor 1516.

N-channel transistor 1502 has a drain electrode coupled to bit line BL, a source electrode coupled to a second terminal of resistive element 1512, and a gate electrode coupled to a program refresh line (PRL) signal.

N-channel transistor 1504 has a drain electrode coupled to complementary bit line BLB, a source electrode coupled to a second terminal of resistive element 1510, and a gate electrode coupled to the PRL signal. P-channel transistor 1524 has a source coupled to supply voltage VDD, a drain coupled to sources of respective P-channel transistors 1520, 1522, and a gate coupled to a first enable signal (AE1). N-channel transistor 1526 has a source coupled to ground or VSS, a drain coupled to sources of respective P-channel transistors 1520, 1522, and a gate coupled to a second enable signal (AE2). P-channel transistor 1520 has a drain coupled Node A and a gate coupled to Node B. P-channel transistor 1522 has a drain coupled to Node B and a gate coupled to Node A.

Figure 16:
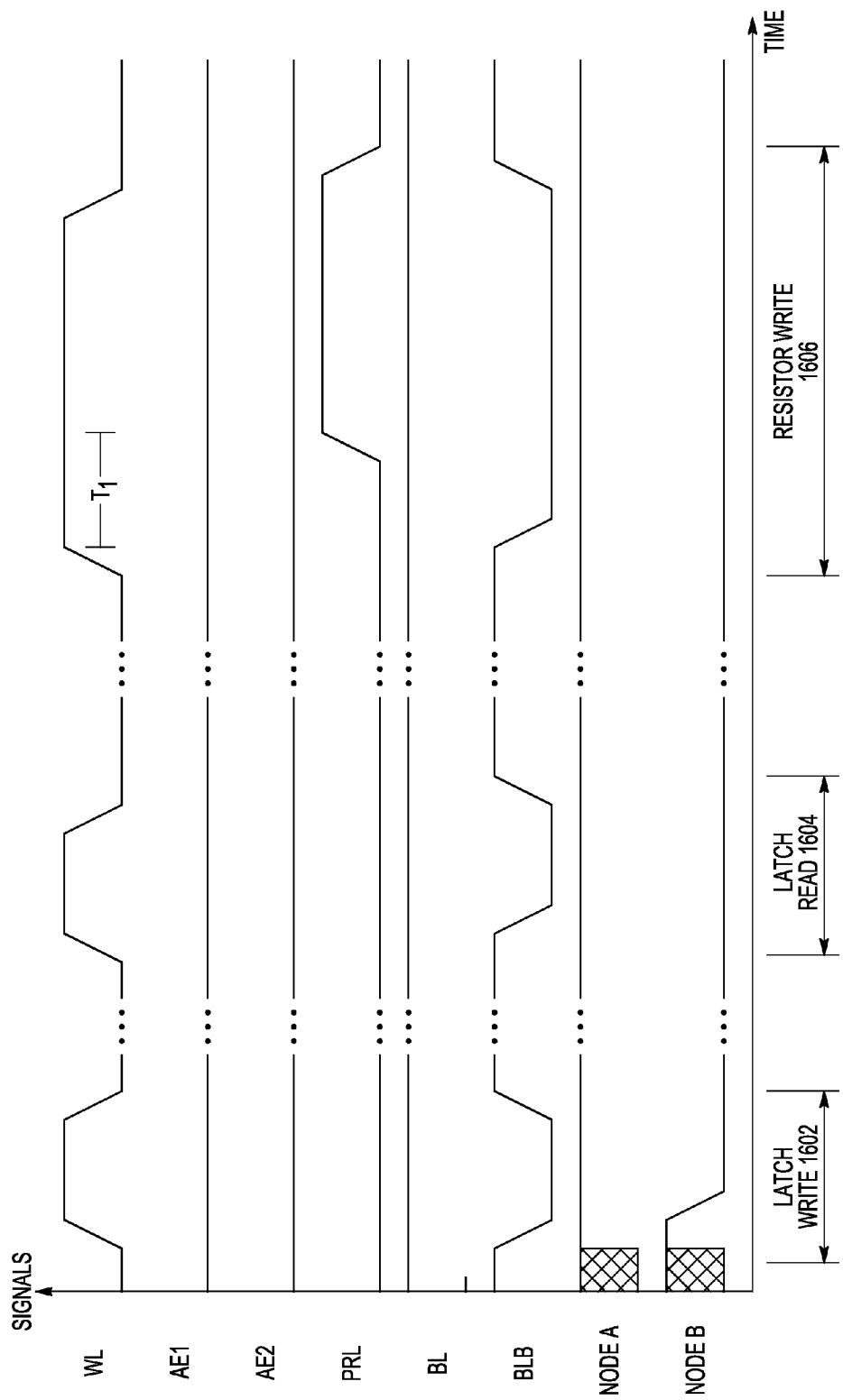
FIG. 16 is a timing diagram showing states of signals in the memory cell of FIG. 15 during latch write, latch read, and resistive element write operations in accordance with one embodiment.

FIG. 16 is a timing diagram showing states of signals in the memory cell 1500 of FIG. 15 during write, read, and resistive element write operations (1602-1606) in accordance with one embodiment. Data is written to the cell similar to a conventional SRAM. During latch write phase 1602, assuming the write data is the complement of existing data state in the cell 1500, the cross-coupled latch at Node B flips from high to low as the word line is asserted, because the complementary bit line (BLB) is held at ground or VSS. Similarly, Node A flips from low to high as the word line is asserted, because the true bit line (BL) remains biased high. The PRL signal is held low during write, so the two resistive elements are floating.

The cross-coupled P-channel transistors 1520, 1522 provide an active load to VDD so refresh by performing a read operation on the cell 1500 is not necessary. To perform a latch read operation, however, the word line is asserted, the true bit line remains biased high, and the complementary bit line is precharged high and then is pulled to ground or VSS. The PRL signal remains biased to ground or VSS. Data remains intact at Nodes A and B. After the data is read, the complementary bit line transitions from ground or VSS to supply voltage VDD and the word line transitions from supply voltage VDD to ground or VSS.

One way to program the pair of resistive elements during resistor write operation 1606 is by reading and latching data from the cell 1500, so the true and complementary bit lines can be actively biased with the read data during the T1 portion of the resistor write operation 1606. Then the word line is kept biased to VDD and the PRL signal is pulsed to VDD. During the PRL signal pulse, resistive elements 1510, 1512 are programmed correctly to match the data in the cell 1500. The P-channel transistors 1520, 1522 also help maintain the proper bias on the bottom of each resistive element 1510, 1512.

If the cell 1500 is sufficiently stable, it may be possible to program the resistive elements 1510, 1512 without first reading the data. In this case, the word line is kept low, true and complementary bit lines are set to VDD, and the PRL signal is pulsed, switching the resistive element 1512 to a high resistive state. Then the true and complementary bit lines are set to ground or VSS, and the PRL signal is pulsed again, switching the resistor 1510 to a low resistive state. This approach allows highly parallel programming of resistors 1510, 1512.

Figure 17:
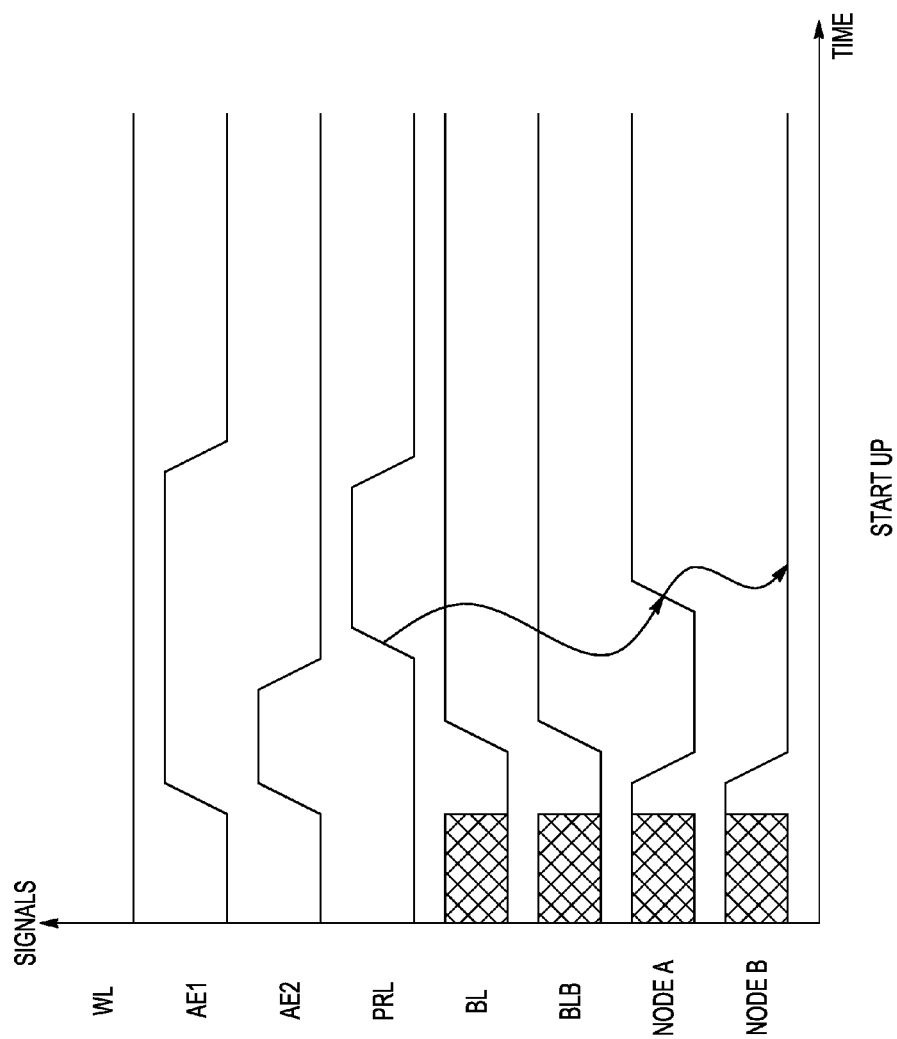
FIG. 17 is a timing diagram showing states of signals in the memory cell of FIG. 15 during start up operation in accordance with one embodiment.

FIG. 17 is a timing diagram showing states of signals in the memory cell of FIG. 15 during start up operation in accordance with one embodiment. Upon startup, AE1 and AE2 are first biased to VDD, ensuring that the array is grounded to VSS and preventing any cells from latching to erroneous data states. Next, AE1 transitions to VSS, allowing the array power supply to float. BL/BLB are then biased to VDD, WL is held low, and PRL is pulsed to VDD, restoring proper data to each cell by means of the differential resistance values of the resistive elements 1510 and 1512, as with the 4T dynamic version of the cell shown in FIG. 10. Finally, PRL transitions to VSS, and the cell operates as a 6-transistor CMOS latch.

By now it should be appreciated that in some embodiments, a memory cell (202) includes a first storage node (A) and a second storage node (B). The second node is a complementary storage node to the first storage node for storing a value in the memory cell. A first bidirectional resistive memory element (BRME) includes a first terminal and a second terminal. A second BRME includes a first terminal and a second terminal. A supply terminal is coupled to the second terminal of the first BRME during a resistive element write of a value to the memory cell. The supply terminal is coupled to the second terminal of the second BRME, the first terminal of the first BRME is coupled to the first storage node A, the first terminal of the second BRME is coupled to the second storage node, and the supply terminal is supplied with a higher voltage for providing a programming voltage across one of the first BRME and second BRME during one phase of the resistive element write and is supplied with a lower voltage for providing a programming voltage across the other one of the first BRME and the second BRME during another phase of the resistive element write.

In another aspect, the memory can further comprise a first access transistor (222) for coupling the first storage node to a first bit line and a second access transistor (226) for coupling the second storage node to a second bit line, the second bit line being a complementary bit line to the first bit line.

In another aspect, a voltage range of the first bit line and the second bit line ranges between a first voltage and a second voltage, the second voltage being higher than the first voltage, wherein the higher voltage is at least as high as the second voltage and the lower voltage is at least as low as the first voltage.

In another aspect, the memory can further cell comprise a first transistor (218) including first current terminal coupled to the first storage node and a control terminal coupled to the second storage node. A second transistor (220) includes first current terminal coupled to the second storage node and a control terminal coupled to the first storage node. A first access transistor (222) couples the first storage node to a first bit line and a second access transistor (226) couples a second access node to a second bit line. The second bit line is a complementary bit line to the first bit line.

In another aspect, during a resistive element write, the one phase can occur before the other phase.

In another aspect, the supply terminal can be coupled to a first voltage control transistor and a second voltage control transistor, the first voltage control transistor is for coupling the supply terminal to a first voltage source providing the higher voltage, the second voltage control transistor is for coupling the supply terminal to a second voltage source. The first voltage control transistor is conductive and the second voltage control transistor is not conductive during the one phase of a resistive element write and the second voltage control transistor is conductive and the first voltage control transistor is not conductive during the other phase of a resistive element write.

In another aspect, during at least one mode of operation of the memory cell, both the first voltage control transistor and the second voltage control transistor are non-conductive.

In another aspect, the memory can further cell comprise a first transistor (822) including a first current terminal coupled to the first storage node (A), a second current terminal for receiving a low supply voltage, and a control terminal coupled to the second storage node. A second transistor (824) includes a first current terminal coupled to the second storage node, a second current terminal for receiving the low supply voltage, and a control terminal coupled to the first storage node. A third transistor (818) includes a first current terminal coupled to the first storage node, a second current terminal for receiving a high supply voltage, and a control terminal coupled to the second storage node. A fourth transistor (820) includes a first current terminal coupled to the second storage node, a second current terminal for receiving the high supply voltage, and a control terminal coupled to the first storage node. The first transistor and the second transistor are of a first conductivity type (N) and the third transistor and the fourth transistor are of a second conductivity type (P) opposite the first conductivity type.

In another aspect, the second current terminal of the third transistor and the second current terminal of the fourth transistor can be each coupled to a high voltage supply terminal to receive a high voltage. During a phase of a startup operation where a value stored in the first BRME and the second BRME can be written to the first storage node and the second storage node. The high voltage supply terminal does not receive the high voltage.

In another embodiment, a memory can include a memory cell with a first storage node (A) and a second storage node (B). The second storage node can be a complementary storage node to the first storage node for storing a value in the memory cell, the memory cell can further include a first bidirectional resistive memory element (BRME) (214) including a first terminal and a second terminal and a second BRME (216) including a first terminal and a second terminal. A method of operating the memory can include performing a resistive element write to the memory cell of a value. During the performing the resistive element write, the first terminal of the first BRME is coupled to the first storage node (A), the second terminal of the first BRME is coupled to a supply terminal, the first terminal of the second BRME is coupled to the second storage node, and the second storage terminal of the second BRME is coupled to the supply terminal. A resistive element write can include one phase where a higher voltage is supplied to the supply terminal and another phase where a lower voltage is supplied to the supply terminal. During the one phase, one of the first BRME and the second BRME is written to a resistive state indicative of the value and during the other phase, the other of the first BRME and the second BRME is written to a resistive state indicative of the value.

In another aspect, during the resistive element write, a first bit line (BL1) can be coupled to the first storage node and a second bit line (BLB1) can be coupled to the second storage node are at complementary voltage levels based on the value being written.

In another aspect, the complementary voltage levels can include a first voltage and a second voltage higher than the first voltage. The higher voltage can be at least as high as the second voltage and the lower voltage can be at least as low as the first voltage.

In another aspect, the method can further comprise prior to performing the resistive element write, performing a latch write to the memory cell of the value. The performing a latch write can write a first voltage level to the first storage node and a second voltage level to the second storage node, the first voltage level and the second voltage level can be complementary voltage levels indicative of the value being written. Performing the resistive element write to the memory cell of the value subsequent to performing the latch write can include driving a first bit line coupled to the first storage node and a second bit line coupled to the second storage node to voltage levels indicative of the first voltage level and the second voltage level respectively.

In another aspect, the method can further comprise, after performing the resistive element write, powering down the memory cell. After powering down the memory cell, the memory cell can be powered up including writing the value as stored in the first BRME and the second BRME to the first storage node and the second storage node. Writing the value includes placing the first storage node and the second storage node at complementary voltage levels indicative of the value.

In another aspect, the writing the value includes supplying the higher voltage to the supply terminal.

In another aspect, after the performing the latch write and prior to performing the resistive element write, the first storage node and the second storage node are each at a voltage level indicative of the value and the first BRME and the second BRME are each at a resistive state indicative of another value different than the value.

In another aspect, the memory cell can further include a first transistor (218) including first current terminal coupled to the first storage node, a second current terminal for receiving a low supply voltage, and a control terminal coupled to the second storage node. The memory cell can further include a second transistor (220) including first current terminal coupled to the second storage node, a second current terminal for receiving the low supply voltage, and a control terminal coupled to the first storage node. The memory cell can further include a third transistor (818) including first current terminal coupled to the first storage node, a second current terminal for receiving a high supply voltage, and a control terminal coupled to the second storage node. The memory cell can further include a fourth transistor (820) including first current terminal coupled to the second storage node, a second current terminal for receiving the high supply voltage, and a control terminal coupled to the first storage node. The first transistor and the second transistor are of a first conductivity type and the third transistor and the forth transistor are of a second conductivity type opposite the first conductivity type.

In another aspect, during a memory operation after the resistive element write, the second current terminals of the third transistor and the fourth transistor can each receive the high supply voltage and the supply terminal can be floating.

In another aspect, the memory can further comprise after performing the resistive element write, powering down the memory cell. After powering down the memory cell, the memory cell can be powered up including writing the value as stored in the first BRME and the second BRME to the first storage node and the second storage node. Writing the value can include placing the first storage node and the second storage node at complementary voltage levels indicative of the value. While writing the value, the second current terminals of the third transistor and the fourth transistor can be coupled to a node that is floating.

In still other embodiments, a method of operating a memory cell can comprise performing a resistive memory write of a value to a memory cell, memory cell including a first bidirectional resistive memory element (BRME) (214) and a second BRME (216), the performing a resistive memory write includes placing a first terminal of the first BRME and a first terminal of the second BRME at a higher voltage level during one phase of the resistive memory write to place one of the first BRME and the second BRME in a first resistive state, the performing a resistive memory write includes placing the first terminal of the first BRME and the first terminal of the second BRME at a lower voltage level during another phase of the resistive memory write to place the other of the first BRME and the second BRME in a second resistive state opposite the first resistive state, the one of the first BRME and the second BRME in the first resistive state and the other of the first BRME and the second BRME in the second resistive state indicative of the value.

This disclosure is presented to enable one of ordinary skill in the art to make and use the present disclosure as provided within the context of a particular application and its requirements. Various modifications to the preferred embodiments will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the scope of the disclosure as defined by the appended claims.

What is claimed is:

1. A memory cell comprising:
a first storage node;
a second storage node, the second storage node complementary to the first storage node;
a first bidirectional resistive memory element (BRME) including a first terminal;
a second BRME including a first terminal;
a first access transistor for coupling the first storage node to a first bit line;
a second access transistor for coupling the second storage node to a second bit line;
a third transistor for directly coupling the first terminal of the first BRME to the second bit line;
a fourth transistor for directly coupling the first terminal of the second BRME to the first bit line.

2. The memory cell of claim 1 wherein the third transistor couples the first terminal of the first BRME to the second bit line and the fourth transistor couples the first terminal of the second BRME to the first bit line during a resistive element write to the memory cell.

3. The memory cell of claim 2 wherein the during a resistive element write, a second terminal of the first BRME is coupled to the first bit line and a second terminal of the second BRME is coupled to the second bit line.

4. The memory of claim 1 wherein a second terminal of the first BRME is coupled to the first storage node and a second terminal of the second BRME is coupled to the second storage node.

5. The memory cell of claim 1 wherein during a resistive element write, a second terminal of the first BRME is coupled to the first bit line through the first access transistor that is conductive, the first terminal of the first BRME is coupled to the second bit line through the third transistor that is conductive, a second terminal of the second BRME is coupled to the second bit line through the second access transistor that is conductive, and the first terminal of the second BRME is coupled to the first bit line through the fourth transistor that is conductive.

6. The memory cell of claim 1 further comprising:
a fifth transistor including a first current terminal coupled to the first storage node, a second current terminal to receive a low supply voltage, and a control terminal coupled to the second storage node;
a sixth transistor including a first current terminal coupled to the second storage node, a second current terminal to receive the low supply voltage, and a control terminal coupled to the first storage node.

7. The memory of claim 6 further comprising:
a seventh transistor including a first current terminal coupled to the first storage node, a second current terminal to receive a high supply voltage, and a control terminal coupled to the second storage node;
an eighth transistor including a first current terminal coupled to the second storage node, a second current terminal to receive the high supply voltage, and a control terminal coupled to the first storage node.

8. The memory of claim 7 wherein during a resistive memory write to the cell, the second current terminal of the seventh transistor and the second current terminal of the eight transistor do not receive the high supply voltage.

9. The memory of claim 1 wherein during a read of the memory cell, the third transistor and the fourth transistor are not conductive.

10. A method of operating a memory cell, the memory cell including a first bidirectional resistive memory element (BRME) and a second BRME, the method comprising:
performing a resistive element write to write a value to the memory cell, the performing including directly coupling a first terminal of the first BRME to a first bit line and a second terminal of the first BRME to a second bit line to place the first BRME in a first resistive state, the second bit line is a complimentary bit line to the first bit line, the performing including directly coupling a first terminal of the second BRME to the second bit line and a second terminal of the second BRME to the first bit line to place the second BRME in a second resistive state, the second resistive state being complementary to the first resistive state, the first BRME being in the first resistive state and the second BRME being in the second resistive state is indicative of the value.

11. The method of claim 10 wherein the memory cell includes a first storage node and a second storage complementary to the first storage node, wherein during the resistive element write, the first terminal of the first BRME is coupled to the first storage node and the first terminal of the second BRME is coupled to the second storage node.

12. The method of claim 11 wherein the memory cell includes a first access transistor and a second access transistor, the first access transistor is made conductive to couple the first storage node to the first bit line and the second access transistor is made conductive to couple the second storage node to the second bit line.

13. The method of claim 11 wherein prior to performing the resistive element write, performing a latch write to the memory cell to place the first storage node and the second storage node at complementary voltage levels indicative of the value, wherein performing the latch write includes coupling the first storage node to the first bit line and coupling the second storage node to the second bit line.

14. The method of claim 13 wherein after performing the latch write but prior to performing the resistive element write, resistive states of the first BRME and the second BRME indicate a different value than the value indicated by the complementary voltage levels of the first storage node and the second storage node.

15. The method of claim 13, wherein performing the resistive element write pulls the first bit line and the second bit line to a first bit line voltage and a second bit line voltage level respectively as indicated by the complementary voltage levels of the storage nodes.

16. The method of claim 10 wherein the performing the resistive element write includes driving the first bit line and the second bit line to complementary voltage levels indicative of the value.

17. The method of claim 10 wherein:

coupling the first terminal of the first BRME to the first bit line includes making a first transistor conductive;

coupling the first terminal of the second BRME to the second bit line includes making a second transistor conductive;

coupling the second terminal of the first BRME to the second bit line includes making a third transistor conductive;

coupling the second terminal of the second BRME to the first bit line includes making a fourth transistor conductive.

18. The method of claim 17 wherein:

a control terminal of the first transistor and a control terminal of a second transistor are coupled to a word line that is asserted to make the first transistor and the second transistor conductive;

a control terminal of the third transistor and a control terminal of the fourth transistor are coupled to a select line that is asserted to make the third transistor and the fourth transistor conductive.

19. The method of claim 10 further comprising:

after performing the resistive element write, powering down the memory cell;

after powering down the memory cell, powering up the memory cell, wherein powering up the memory cell includes writing the value as stored in the first BRME and the second BRME to the first storage node and the second storage node, wherein the writing the value includes placing the first storage node and the second storage node at complementary voltage levels indicative of the value.

20. The method of claim 19 wherein during the powering up the memory cell, the first bit line and the second bit line are driven to a high voltage value, the second terminal of the first BRME is coupled to the second bit line, the second terminal of the second BRME is coupled to the first bit line, the first terminal of the first BRME is coupled to the first storage node and the first terminal of the second BRME is coupled to the second storage node.

* * * * *